US011468919B2

(12) United States Patent
Park et al.

(10) Patent No.: US 11,468,919 B2
(45) Date of Patent: Oct. 11, 2022

(54) SEMICONDUCTOR DEVICE INCLUDING A SPACER IN CONTACT WITH AN UPPER SURFACE OF A SILICIDE LAYER

(71) Applicant: SAMSUNG ELECTRONICS CO., LTD., Suwon-si (KR)

(72) Inventors: Tae Jin Park, Yongin-si (KR); Won Seok Yoo, Seoul (KR); Keun Nam Kim, Yongin-si (KR); Hyo-Sub Kim, Seoul (KR); So Hyun Park, Seoul (KR); In Kyoung Heo, Hwaseong-si (KR); Yoo Sang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 76 days.

(21) Appl. No.: 16/841,850

(22) Filed: Apr. 7, 2020

(65) Prior Publication Data

US 2021/0035613 A1 Feb. 4, 2021

(30) Foreign Application Priority Data

Jul. 29, 2019 (KR) ........................ 10-2019-0091445

(51) Int. Cl.
 *G11C 5/06* (2006.01)
 *H01L 27/108* (2006.01)
(52) U.S. Cl.
 CPC ........ *G11C 5/063* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 27/10888* (2013.01)

(58) Field of Classification Search
 CPC ............. G11C 5/063; H01L 27/10814; H01L 27/10823; H01L 27/10855; H01L 27/10876; H01L 27/10885; H01L 27/10888; H01L 21/7682; H01L 21/76831; H01L 21/76832; H01L 21/76877; H01L 21/76897; H01L 23/5223; H01L 23/5226; H01L 23/528; H01L 23/535
 See application file for complete search history.

(56) References Cited

U.S. PATENT DOCUMENTS

| 9,099,343 | B2 | 8/2015 | Kim et al. |
| 9,130,009 | B2 | 9/2015 | Manabe |
| 9,214,382 | B2 | 12/2015 | Lee et al. |
| 9,318,379 | B2 | 4/2016 | Lee et al. |
| 9,379,002 | B2 | 6/2016 | Han et al. |
| 9,543,202 | B2 | 1/2017 | Koo et al. |
| 10,037,999 | B2 | 7/2018 | Kim et al. |
| 2014/0231892 | A1* | 8/2014 | Song ................. H01L 21/76897 257/296 |

(Continued)

*Primary Examiner* — Nicholas J Tobergte
*Assistant Examiner* — Tenley H Schofield
(74) *Attorney, Agent, or Firm* — F. Chau & Associates, LLC

(57) ABSTRACT

A semiconductor device is provided. The semiconductor device includes a substrate a bit line structure disposed on the substrate, a trench adjacent to at least one side of the bit line structure, a storage contact structure disposed within the trench, and comprising a storage contact, a silicide layer, and a storage pad which are stacked sequentially. A spacer structure is disposed between the bit line structure and the storage contact structure.

20 Claims, 19 Drawing Sheets

(56) References Cited

U.S. PATENT DOCUMENTS

| | | | |
|---|---|---|---|
| 2014/0299989 A1* | 10/2014 | Lim | ................. H01L 27/10876 |
| | | | 257/751 |
| 2015/0061136 A1* | 3/2015 | Yoo | .................... H01L 21/7682 |
| | | | 257/755 |
| 2015/0214152 A1* | 7/2015 | Park | ................. H01L 27/10814 |
| | | | 257/754 |
| 2015/0214291 A1* | 7/2015 | Park | ....................... H01L 24/08 |
| | | | 257/503 |
| 2016/0247760 A1* | 8/2016 | Lee | .................. H01L 23/53266 |
| 2016/0300795 A1* | 10/2016 | Kim | ................. H01L 27/10814 |
| 2017/0018553 A1* | 1/2017 | Lee | ................. H01L 27/10888 |
| 2018/0040560 A1* | 2/2018 | Kim | ...................... H01L 21/764 |
| 2019/0103302 A1 | 4/2019 | Yoon | |

* cited by examiner

SEMICONDUCTOR DEVICE INCLUDING A SPACER IN CONTACT WITH AN UPPER SURFACE OF A SILICIDE LAYER

This application claims priority under 35 U.S.C. § 119 to Korean Patent Application. No. 10-2019-0091445, filed on Jul. 29, 2019, the disclosure of which is incorporated by reference herein in its entirety.

TECHNICAL FIELD

The present inventive concept relates to a semiconductor device.

DESCRIPTION OF THE RELATED ART

As semiconductor devices become increasingly integrated, separate circuit patterns have also become further miniaturized to implement more semiconductor devices on a same area.

However, semiconductor devices featuring enhanced integration experience parasitic capacitance and leakage current. Because parasitic capacitance and leakage current degrade an operating efficiency of a semiconductor device, a semiconductor device that can minimize operating efficiency degradation is required.

SUMMARY

According to an exemplary embodiment of the present inventive concept, there is provided a semiconductor device including a substrate. A bit line structure is disposed on the substrate. A trench is disposed adjacent to at least one side of the bit line structure. A storage contact structure is disposed within the trench and includes a storage contact, a silicide layer, and a storage pad. A spacer structure is disposed between the bit line structure and the storage contact structure.

According to an exemplars embodiment of the present inventive concept, there is provided a semiconductor device including a substrate. A bit line contact is disposed on the substrate. A bit line structure is disposed on the bit line contact. A trench is disposed adjacent to at least one side of the bit line structure. A storage contact structure is disposed within the trench, and includes a storage contact, a silicide layer, and a storage pad which are stacked sequentially. A first spacer is in contact with a sidewall of the bit line structure. A second spacer is disposed on the first spacer and in contact with a sidewall of the storage pad and an upper surface of the silicide layer.

According to an exemplary embodiment of the present inventive concept, there is provided a semiconductor device including a substrate. The substrate includes an isolation layer and an active region adjacent to the isolation layer. A bit line contact is disposed on the substrate. A bit line structure is disposed on the bit line contact. A trench is disposed adjacent to at least one side of the bit line structure. A storage contact structure is disposed within the trench, and includes a storage contact, a silicide layer, and a storage pad which are stacked sequentially. First, second, third, and fourth spacers are disposed between the bit line structure and the storage contact structure. The first, second, third, and fourth spacers are stacked sequentially on a sidewall of the bit line structure. A capacitor is disposed on the storage contact structure and electrically connected with the storage pad. An upper surface of the storage contact is formed lower than an upper surface of the bit line contact. A lower surface of the fourth spacer is in contact with an upper surface of the silicide layer.

BRIEF DESCRIPTION OF THE DRAWINGS

The above and other features of the present inventive concept will become more apparent by describing in detail exemplary embodiments thereof with reference to the accompanying drawings, in which:

FIG. 11 is a cross-sectional view illustrating a semiconductor device according to an exemplary embodiment of the present inventive concept;

DETAILED DESCRIPTION OF THE EMBODIMENTS

Hereinbelow, a semiconductor device according to exemplary embodiments of the present inventive concept will be described with reference to FIGS. 1 to 3.

Figure 1:
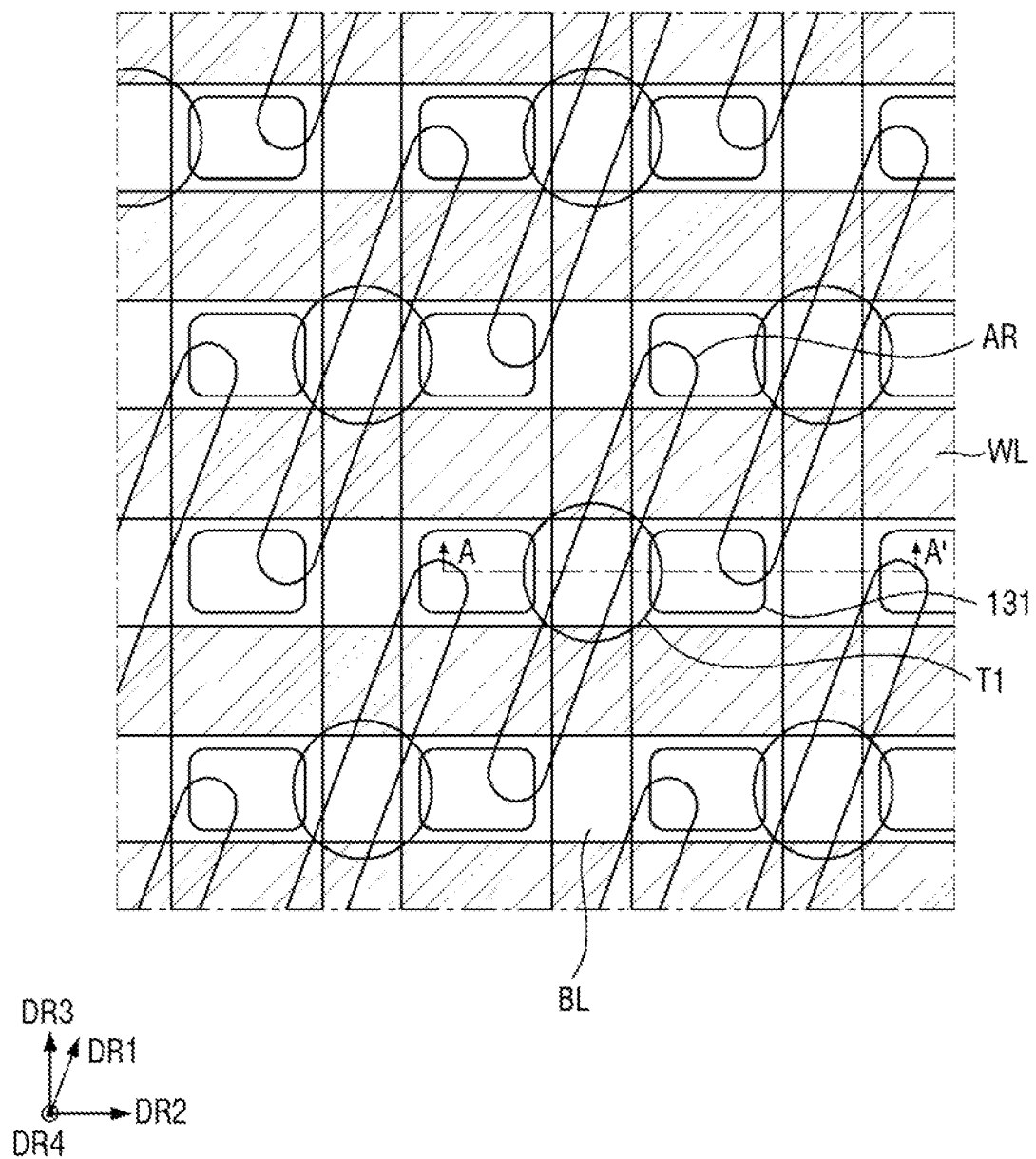
FIG. 1 is a schematic layout diagram illustrating a semiconductor device according to an exemplary embodiment of the present inventive concept.

FIG. 1 is a schematic layout diagram illustrating a semiconductor device according to an exemplary embodiment of the present inventive concept. FIG. 2 is a cross-sectional view illustrating a cross-section taken on line A-A' of FIG. 1. FIG. 3 is an enlarged view illustrating a section R of FIG. 2.

Referring to FIG. 1, the semiconductor device may include a plurality of active regions AR. The active region AR may be defined by an isolation layer 110 (FIG. 2) which is formed within a substrate 100 (FIG. 2). For example, the active regions AR may refer to the tapered fin shaped portions of the patterned substrate 100 that have a complementary shape to the adjacent isolation layers 110. The active region AR may be extended in a first direction (e.g., a DR1 direction). The first direction (e.g., the DR1 direction) may refer to a direction that is oblique to a second direction (e.g., the DR2 direction) and an orthogonally intersecting third direction (e.g., a DR3 direction).

With a decreased design rule of the semiconductor device, the active region AR may be disposed in a bar-like form of a diagonal line or oblique line, as illustrated.

On the active regions AR and across the active regions AR, a plurality of gate electrodes may be disposed. The plurality of gate electrodes may be extended in parallel to one another in a second direction (e.g., the DR2 direction) and may be spaced apart in the third direction (e.g., the DR3 direction). The plurality of gate electrodes may be, for example, a plurality of word lines WL.

The word lines WL may be disposed by the same pitch. A width of the word lines WL or a pitch between the word lines WL may be determined according to the design rule.

On the word lines WL and orthogonally to the word lines WL, a plurality of bit lines BL extended in a third direction (e.g., the DR3 direction) may be disposed. The plurality of bit lines BL may be extended in parallel to one another in the third direction (e.g., the DR3 direction).

The bit lines BL may be disposed by the same pitch. A width of the bit lines BL or a pitch between the bit lines BL may be determined according to the design rule.

Figure 2:
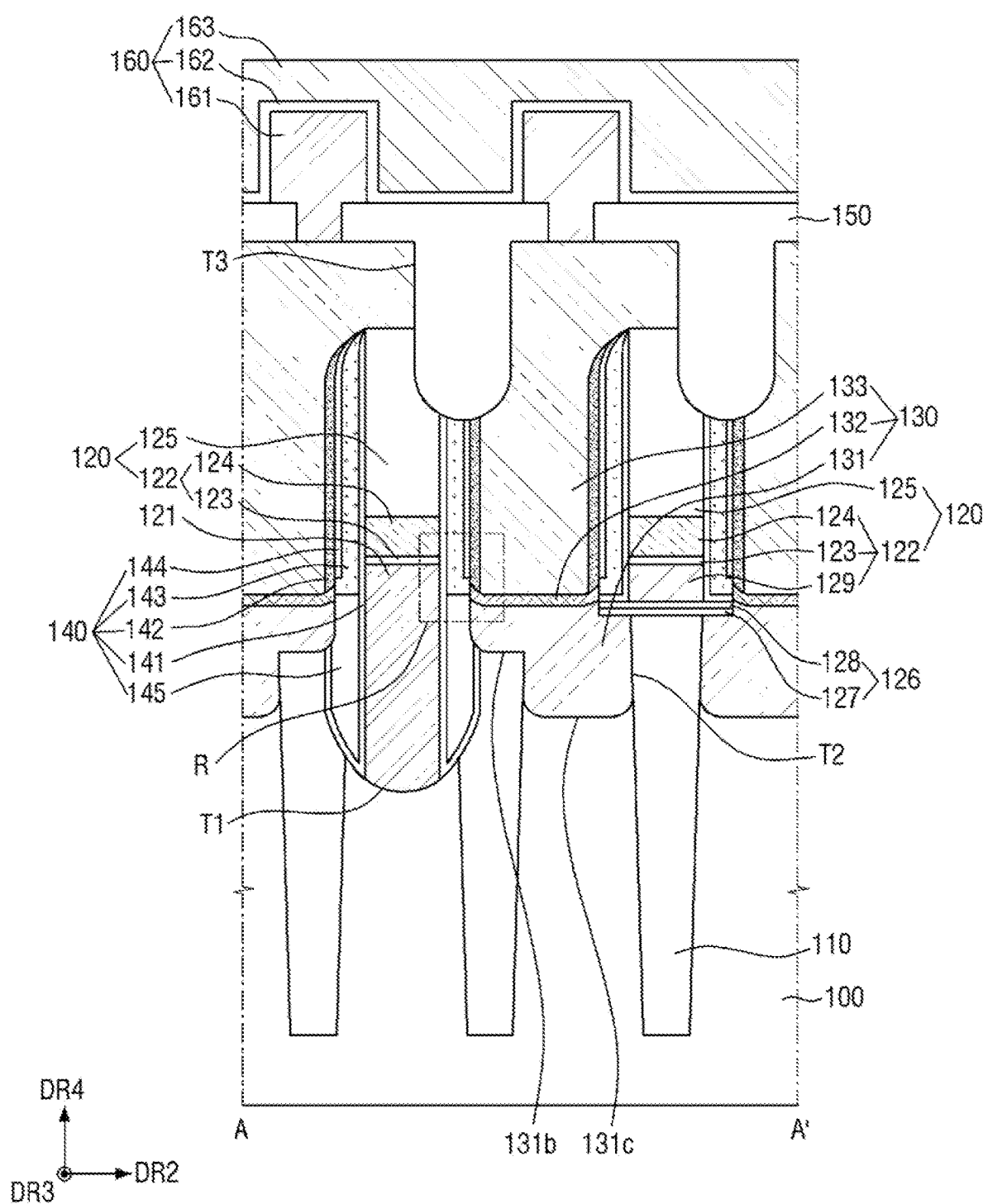
FIG. 2 is a cross-sectional view illustrating a cross-section taken on line A-A' of FIG. 1 according to an exemplary embodiment of the present inventive concept.
Figure 3:
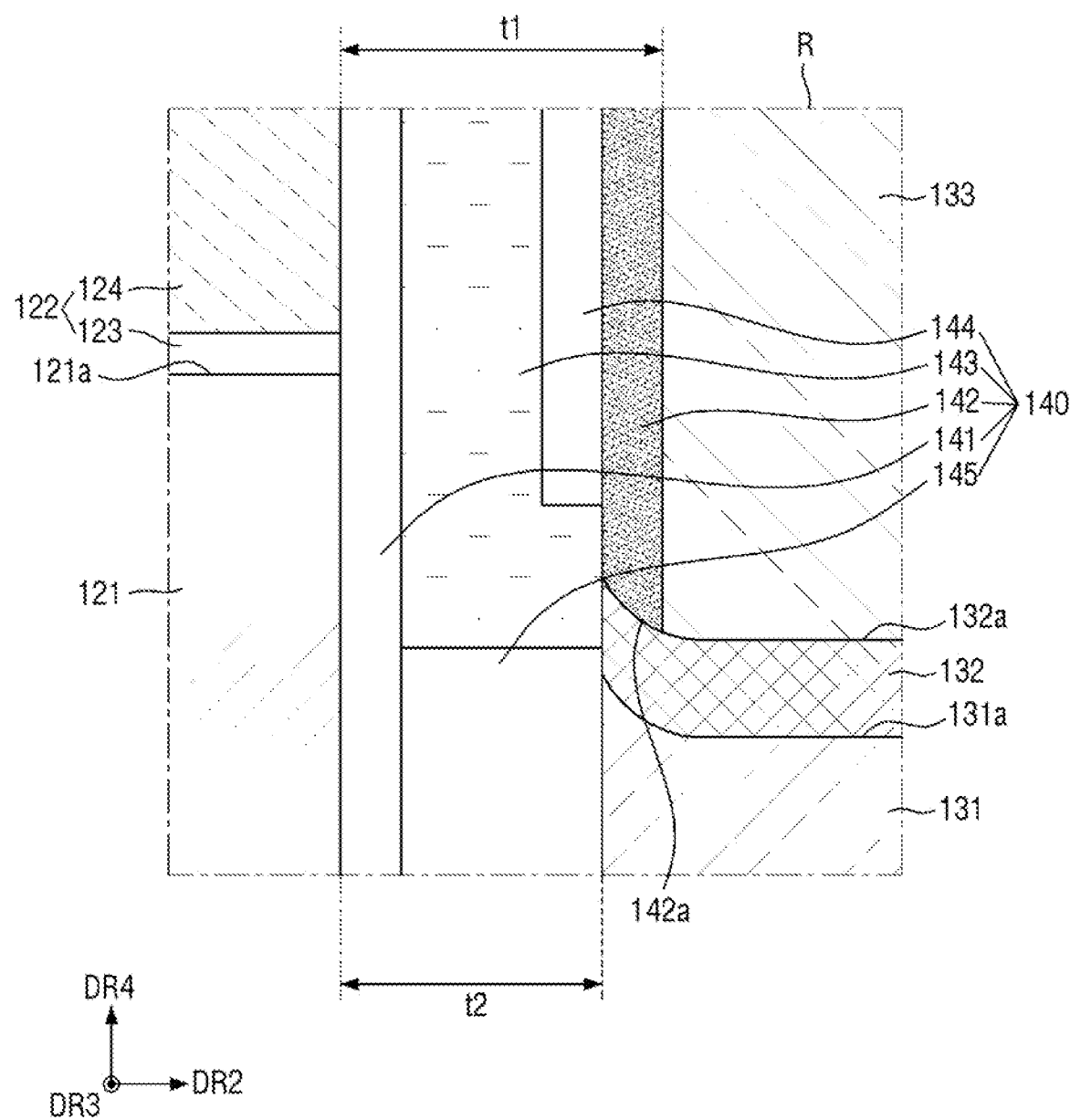
FIG. 3 is an enlarged view illustrating a section R of FIG. 2 according to an exemplary embodiment of the present inventive concept.

Referring to FIGS. 1 to 3, the semiconductor device according to an exemplary embodiment of the present inventive concept includes the substrate 100, the isolation layer 110, the word lines WL, a bit line structure 120, a bit line contact 121, an insulation pattern 126, a storage contact structure 130, a spacer structure 140, an interlayer insulation film 150 and a capacitor 160.

The substrate 100 may be bulk silicon or a silicon-on-insulator (SOI). Alternatively, the substrate 100 may be a silicon substrate, or may include other materials such as silicon germanium silicon germanium on insulator (SGOI), indium antimonide lead telluride compound, indium arsenide, indium phosphide, gallium arsenide, and/or gallium antimonide, but the present inventive concept is not limited thereto. In the following description, it is assumed that the substrate 100 is a silicon substrate.

The isolation layer 110 may be formed within the substrate 100. The isolation layer 110 may have a shallow trench isolation (STI) structure having excellent device isolation characteristics. For example, the isolation layer 110 may have a tapered structure that broadens in the second direction (e.g., the DR2 direction) in a direction moving away from the substrate 100 in the fourth direction (e.g., the DR4 direction). The isolation layer 110 may define the active region AR within the substrate 100.

The active region AR defined by the isolation layer 110 may have a long island form including a short axis and a long axis, as illustrated in FIG. 1. The active region AR may have a diagonal line form having, an angle of less than 90 degrees with respect to the word lines WL formed within the isolation layer 110. Further, the active region AR may have a diagonal line form having an angle of less than 90 degrees with respect to the bit lines BL formed on the isolation layer 110. The bit line structures 120 may comprise the bit lines BL. The active region AR may be extended in the first direction (e.g., the DR1 direction) that has a certain angle with respect to the second direction (e.g., the DR2 direction) and the third direction (e.g., the DR3 direction).

The isolation layer 110 may include, for example, at least one of a silicon oxide film, a silicon nitride film, and a silicon oxynitride film, but the present inventive concept is not limited thereto.

Although it is illustrated in FIG. 2 that the isolation layer 110 is formed as a single insulation film, this is only for convenience of explanation, and the present inventive concept is not limited thereto. For example, the isolation layer 110 may have a multilayer structure.

The insulation pattern 126 may be formed on the substrate 100 and the isolation layer 110. The insulation pattern 126 may be extended along a top surface of the substrate 100 and a top surface of the isolation layer 110 in a region where the bit line structure 120 and the storage contact structure 130 are not formed.

The insulation pattern 126 may be a simile-layered film, or as illustrated in FIG. 2, the insulation pattern 126 may be a multi-layered film including a first insulation film 127 and a second insulation film 128. The first insulation film 127 may include silicon oxide, for example. The second insulation film 128 may include a material having a different etch selectivity from that of the first insulation film 127. For example, the second insulation film 128 may include silicon nitride.

The bit line structure 120 may be disposed on the substrate 100, the isolation layer 110, and the insulation pattern 126. The bit line structure 120 may be extended longitudinally along the third direction (e.g., the DR3 direction) across the active regions AR and the word lines WL. For example, the bit line structure 120 may traverse the active regions AR obliquely, and traverse the word lines WL orthogonally. A plurality of bit line structures 120 may be extended in parallel to one another. For example, the bit line structures 120 may be spaced apart in the second direction (e.g., the DR2 direction). In addition, the plurality of bit line structures 120 may be spaced apart from one another by the same pitch.

The bit line structure 120 may include a bit line 122 disposed on the substrate 100 and a capping pattern 125 disposed on the bit line 122.

The bit line 122 may include a first conductive film 129, a second conductive film 123, and/or a third conductive film 124 which are stacked sequentially on the substrate 100. However, the present inventive concept is not limited thereto. In other words, in an exemplary embodiment of the present inventive concept, the bit line 122 may be a single-layered film.

The first conductive film 129, the second conductive film 123, and the third conductive film 124 may respectively include, for example, polysilicon, TiN, TiSiN, tungsten, tungsten silicide, and/or a combination thereof. For example, the first conductive film 129 may include polysilicon, the second conductive film 123 may include TiSiN, and the third conductive film 124 may include tungsten. However, the present inventive concept is not limited thereto.

The capping pattern 125 may be disposed on the bit line 122. In other words, the capping pattern 125 may be disposed on the third conductive film 124. The capping pattern 125 may include silicon nitride, although the present inventive concept is not limited thereto.

The bit line contact 121 may penetrate through the insulation pattern 126 in a fourth direction (e.g., the DR4 direction) to connect the active region AR of the substrate 100 with the bit line structure 120. For example, the substrate 100 may include a first trench T1 formed within the active region AR and the isolation layer 110. The first trench T1 may penetrate through the insulation pattern 126 to expose a portion of the active region AR. The bit line contact 121 may be formed within the first trench. T1 to connect the active regions AR of the substrate 100 and the bit line 122.

As shown in FIG. 1, the first trench T1 may expose a center of the active region AR. The bit line contact 121 may be connected with the center of the active region AR. A portion of the first trench T1 may overlap a portion of the isolation layer 110. The first trench T1 may expose a portion of the isolation layer 110 as well as a portion of the substrate 100.

The bit line contact 121 may include a conductive material. The bit line 122 of the bit line structure 120 may be electrically connected with the active region AR of the substrate 100. The active region AR of the substrate 100 connected with the bit line contact 121 may function as source and drain regions.

In an exemplary embodiment of the present inventive concept, the bit line contact 121 may include the same material as the first conductive film 129. For example, the bit line contact 121 may include polysilicon. However, the present inventive concept is not limited thereto, and according to a fabricating process, the bit line contact 121 may include a material different from the first conductive film 129.

The spacer structure 140 may be extended along a sidewall of the bit line structure 120. For example, the spacer structure 140 may be extended in the third direction (e.g., the DR3 direction) along the sidewall of the bit line structure 120.

A portion of the spacer structure 140 may be disposed within the first trench T1. For example, a lower portion of the spacer structure 140 may be extended along a sidewall of the bit line contact 121 as shown in FIG. 2. A lower portion of the bit line contact 121 may fill a portion of the first trench T1 (e.g., a central portion), and the lower portion of the spacer structure 140 may fill the other portion of the first trench T1 (e.g., portions straddling the central portion of the first trench T1 filled by the bit line contact 121). The spacer structure 140 may be disposed on the insulation pattern 126 in a region of the bit line structure 120 where the bit line contact 121 is not disposed (e.g., an end portion of the active area AR).

The spacer structure 140 may be a multi-layered film formed in a combination of various types of insulating materials. The spacer structure 140 may include, for example, first to fifth spacers 141, 142, 143, 144, 145.

The first spacer 141 may extend along respective sidewalls of the bit line structure 120 and the bit line contact 121. The first spacer 141 may be in contact with the respective sidewalls of the bit line structure 120 and the bit line contact 121. Although it is illustrated in FIG. 2 that the first spacer 141 completely covers the sidewall of the bit line structure 120, the present inventive concept is not limited thereto. In other words, in an exemplary embodiment of the present inventive concept, the first spacer 141 may cover only a portion of the sidewall of the bit line structure 120.

The first spacer 141 may extend along the sidewall of the bit line contact 121 and a profile of the first trench T1 within the first trench T1. The interior space of the first trench T1 may be filled in with a fifth spacer 145.

The second spacer 142 may extend along the sidewall of the bit line contact 121 on the first spacer 141. The second spacer 142 may be disposed along a sidewall of a second trench T2 on a silicide layer 132. For example, the silicide layer 132 may extend across an upper surface of the substrate 100 in the second direction (e.g., the DR2 direction) between adjacent bit line structures 120. The second spacer 142 may at least partially surround the bit line structure 120, extending in the fourth direction (e.g., the DR4 direction) from an end portion of the silicide layer 132 adjacent to the bit line structure 120 away from the substrate 100.

The second spacer 142 may be in contact with a sidewall of a storage pad 133. For example, the second spacer 142 may extend in the fourth direction at least partially surrounding the storage pad 133. A lower surface 142a of the second spacer 142 may be in contact with an upper surface 132a of the silicide layer 132. In other words, the lower surface 142a of the second spacer 142 may overlap the upper surface 132a of die silicide layer 132 in the fourth direction (e.g., the DR4 direction).

The third spacer 143 may extend along the sidewall of the bit line contact 121 between the first spacer 141 and the second spacer 142. One sidewall of the third spacer 143 may be in contact with the first spacer 141. A lower portion of the other sidewall of the third spacer 143 may be in contact with the second spacer 142. For example, a lower portion of the third spacer 143 is disposed on the fifth spacer 145 and includes an orthogonally extending segment that contacts a sidewall of the second spacer 142 and a portion of the second spacer 142.

Although FIG. 3 depicts that the lower portion of the other sidewall of the third spacer 143 is in contact with a sidewall of the silicide layer 132, the present inventive concept is not limited thereto.

The fourth spacer 144 may extend alone the sidewall of the bit line contact 121 between the second spacer 142 and the third spacer 143. For example, the fourth spacer 144 may extend from an upper surface of the orthogonally extending segment of the lower portion of the third spacer 143 in parallel to a sidewall of an upper portion of the bit line contact 121 and a sidewall of the storage pad 133. One sidewall of the fourth spacer 144 may be in contact with the third spacer 143. The other sidewall of the fourth spacer 144 may be in contact with the second spacer 142.

A lower surface of the fourth spacer 144 may be in contact with the third spacer 143. However, the present inventive concept is not limited thereto. In other words, in an exemplary embodiment of the present inventive concept, the lower surface of the fourth spacer 144 may be in contact with the fifth spacer 145.

The fifth spacer 145 may be disposed to fill the first trench T1 on the first spacer 141. For example, the fifth spacer 145 may be disposed to fill a region of the first trench T1 remained after the bit line contact 121 and the first spacer 141 are filled.

An upper surface of the fifth spacer 145 may be in contact with, a lower surface of the third spacer 143. Although FIG. 3 depicts that the upper surface of the fifth spacer 145 is in contact with only the lower surface of the third spacer 143, the present inventive concept is not limited thereto. In other words, in an exemplary embodiment of the present inventive concept, the upper surface of the fifth spacer 145 may be in contact with the lower surface of the third spacer 143 and the lower surface of the fourth spacer 144.

Although FIG. 3 depicts that a portion of a sidewall of the fifth spacer 145 is in contact with the sidewall of the silicide layer 132, the present inventive concept is not limited thereto. For example, the sidewall of an upper portion of the fifth spacer 145 may not be disposed at a same level as a lower Surface of the silicide layer 132, or an intervening layer may be present.

The first to fifth spacers 141, 142, 143, 144, 145 may respectively include an insulating material. For example, each of the first to fifth spacers 141, 142, 143, 144, 145 may include at least one of silicon nitride (SiN), silicon oxynitride (SiON), silicon oxide (SiO$_2$), silicon oxycarbide (SiOC), silicon carbonitride (SiCN), silicon oxycarbonitride (SiOCN), and a combination thereof, but the present inventive concept is not limited thereto. The first to fifth spacers 141, 142, 143, 144, 145 may respectively include the same material, but the present inventive conceptis not limited thereto. In other words, in an exemplary embodiment of the present inventive concept, the first to fifth spacers 141, 142, 143, 144, 145 may respectively include different materials.

A thickness of the spacer structure 140 in the second direction (e.g., the DR2 direction) that is disposed on an upper portion of the silicide layer 132 may be larger than a thickness of the spacer structure 140 in the second direction (e.g., the DR2 direction) that is disposed on a lower portion of the silicide layer 132. This is because the spacer structure 140 disposed on the upper portion of the silicide layer 132 further includes the second spacer 142.

For example, as shown in FIG. 3, a first thickness t1 of the spacer structure 140 in the second direction e.g., the DR2 direction) that is in contact with a sidewall of the storage pad 133 may be larger than a second thickness t2 of the spacer structure 140 in the second direction (e.g., the DR2 direction) that is in contact with a sidewall of a storage contact 131.

The second trench T2 may be formed adjacent to at least one side of the bit line structure 120. For example, the second trench T2 may be formed adjacent to, at least one side of the bit line structure 120, the bit line contact 121, and the spacer structure 140.

The second trench T2 may extend to the inside of the substrate 100, The second trench T2 may penetrate through the insulation pattern 126 in the fourth direction (e.g., the DR4 direction) to expose a portion of the isolation layer 110 and a portion of the active region AR of the substrate 100. In addition, the second trench T2 may expose a portion of the lower surface of the insulation pattern 126.

A lower surface of the second trench T2 may have a stepped portion. For example, a lower surface of the second trench T2 formed on the isolation layer 110 may be higher than a lower surface of the second trench T2 on the active region AR of the substrate 100. However, the present inventive concept is not limited thereto, hi other words, in an exemplary embodiment of the present inventive concept, the lower surface of the second trench T2 formed on the isolation layer 110 may be formed on the same plane as the lower surface of the second trench T2 formed on the active region AR of the substrate 100.

The storage contact structure 130 may be disposed within the second trench T2. In other words, the storage contact structure 130 may be disposed on the isolation layer 110 and the active region AR of the substrate 100. The storage contact structure 130 may penetrate through the insulation pattern 126 in the fourth direction (e.g., the DR4 direction) to electrically connect the active region AR of the substrate 100 and the capacitor 160.

The storage contact structure 130 may be spaced apart from the bit line contact 121 and the bit line 122. In other words, the storage contact structure 130 may be electrically insulated, from the bit line contact 121 and the bit line 122.

The storage contact structure 130 may include the storage contact 131, the silicide layer 132, and the storage pad 133 which are stacked sequentially within the second trench T2.

The storage contact 131 may be disposed on the isolation layer 110 and the active region AR of the substrate 100 within the second trench T2. In other words, the storage contact 131 may overlap a portion of the isolation layer 110 and a portion of the active region AR of the substrate 100 in the fourth direction (e.g., the DR4 direction). The active region AR of the substrate 100 in contact with the storage contact 131 may function as source and drain regions.

An upper surface 131a of the storage contact 131 may be lower than an upper surface 121a of the bit line contact 121.

A lower surface of the storage contact 131 may have a stepped portion. For example, the storage contact 131 may include a first lower surface 131b in contact with an upper surface of the isolation layer 110, and a second lower surface 131c in contact with the active region AR of the substrate 100. In an exemplary embodiment of the present inventive concept, the storage contact 131 may be in contact with a lower surface of the insulation pattern 126. However, the present inventive concept is not limited thereto.

The storage contact 131 may include a conductive material. The storage contact 131 may include, for example, polysilicon, although the present inventive concept is not limited thereto.

The silicide layer 132 may be disposed on the storage contact 131 within the second trench T2. The silicide layer 132 may be disposed to completely cover the upper surface 131a of the storage contact 131 within the second trench T2. For example, each of opposite ends of the silicide layer 132 may contact a lower surface of a respective second spacer 142, and the middle portion between opposite ends of the silicide layer 132 may overlap an uppermost surface of the storage contact 131. However, the present inventive concept is not limited thereto.

The upper surface 132a of the silicide layer 132 may be formed to be lower than the upper surface 121a of the bit line contact 121. However, the present inventive concept is not limited thereto.

The upper surface 132a of the silicide layer 132 may be in contact with the lower surface 142a of the second spacer 142. In other words, the lower surface 142a of the second spacer 142 may completely overlap a portion of the upper surface 132a of the silicide layer 132 (e.g., a curved portion).

The silicide layer 132 may include, for example, cobalt silicon (CoSi$_x$), but the present inventive concept is not limited thereto.

The storage pad 133 may be disposed on the silicide layer 132 within the second trench T2. The storage pad 133 may be electrically connected with the storage contact 131 through the silicide layer 132.

In an exemplary embodiment of the present inventive concept, an upper surface of the storage pad 133 may be higher than an upper surface of the bit line structure 120. In other words, the storage pad 133 may be disposed to cover a portion of the upper surface of the bit line structure 120.

The storage pad 133 may form a plurality of isolation regions which are spaced apart from one another. A plurality of storage pads 133 may be electrically connected with the storage contacts 131 forming the plurality of isolation regions.

A third trench T3 may be formed on a portion of the bit line structure 120, a portion of the spacer structure 140, and a portion of the storage pad 133 adjacent to the spacer structure 140. The plurality of storage pads 133 may be isolated from one another by the third trench T3.

The storage pad 133 may include, for example, at least one semiconductor material doped with impurity, conductive silicide compound, conductive metal nitride and/or a metal.

The interlayer insulation film 150 may be disposed on the storage pad 133 and the bit line structure 120. In addition, the interlayer insulation film 150 may be disposed to fill the third trench T3. The interlayer insulation film 150 may define regions between the storage pads 133 forming the plurality of isolation regions. The interlayer insulation film 150 may be patterned so as to expose a portion of the upper surface of the storage pad 133.

The interlayer insulation film 150 may electrically isolate the plurality of storage pads 133 from one another. The interlayer insulation film 150 may include an insulating material. The interlayer insulation film 150 may include, for example, at least one of a silicon oxide film, a silicon nitride film, a silicon oxynitride film, and a combination thereof, but the present inventive concept is not limited thereto.

The capacitor 160 may be disposed on the interlayer insulation film 150 and the storage pad 133. The capacitor 160 may be connected with a portion of the upper surface of the storage pad 133 exposed by the interlayer insulation film 150. As a result, the capacitor 160 may be electrically connected with source and drain regions formed in the active region AR of the substrate 100 through the storage pad 133, the silicide layer 132, and the storage contact 131.

The capacitor 160 may include a lower electrode 161, a capacitor dielectric film 162, and an upper electrode 163.

The lower electrode 161 may be extended in the fourth direction (e.g., the DR4 direction) from an upper surface of the storage pad 133. The lower electrode 161 may have a lower portion that corresponds to a space between adjacent interlayer insulation films 150 that partially overlap an upper surface of the storage pad 133, and an upper portion that partially overlaps an upper surface of the adjacent interlayer insulation films 150. For example, the width of the upper portion of the lower electrode 161 in the second direction (e.g., the DR2 direction) may be greater than a width of the lower portion of the lower electrode 161. The lower electrode 161 may include, for example, at least one of doped semiconductor material, conductive metal nitride (e.g., titanium nitride, tantalum nitride, or tungsten nitride, etc.), metal (e.g., ruthenium, iridium, titanium or tantalum, etc.), conductive metal oxide (e.g., iridium oxide, etc.), and so on, but the present inventive concept is not limited thereto.

The capacitor dielectric film 162 may be disposed on the lower electrode 161. The capacitor dielectric film 162 may be disposed along a sidewall and an upper surface of the lower electrode 161. For example the capacitor dielectric film 162 may line the exposed upper surface of the lower electrode 161. The capacitor dielectric film 162 may include, for example, at least one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present inventive concept is not limited thereto.

The upper electrode 163 may be disposed on the capacitor dielectric film 162. The upper electrode 163 may be disposed to at least partially cover the lower electrode 161. The upper electrode 163 may include, for example, at least one of doped semiconductor material, metal, conductive metal nitride, and metal silicide.

The capacitor dielectric film 162 may be disposed between the lower electrode 161 and the upper electrode 163. The capacitor 160 may store charges within the capacitor dielectric film 162 by using potential difference generated between the lower electrode 161 and the upper electrode 163.

Although it is illustrated in FIG. 2 that the lower electrode 161 has a pillar, shape, the present inventive concept is not limited thereto. In other words, in an exemplary embodiment of the present inventive concept, the lower electrode 161 may have a cylindrical shape.

The semiconductor device according to an exemplary embodiment of the present inventive concept has the additional spacer 142 formed between the bit line structure 120 and the storage contact structure 130 in contact with the upper surface of the silicide layer 132, such that reliability can be increased.

In addition, in the semiconductor device according to an exemplary embodiment of the present inventive concept, the storage pad 133 is disposed adjacent to the active region AR of the substrate 100, such that reliability can be increased. For example, the storage pad 133 may overlap the action region AR in the fourth direction (e.g., the DR4 direction).

Hereinbelow, a method for fabricating a semiconductor device according to an exemplary embodiment of the present. Inventive concept will be described with reference to FIG. 2, and FIGS. 4, 5, 6, 7, 8, 9, 10 and 11.

FIGS. 4, 5, 6, 7, 8, 9, 10 and 11 are cross-sectional views, illustrating intermediate stages of fabrication in a method for fabricating a semiconductor device according to an exemplary embodiment of the present inventive concept.

Figure 4:
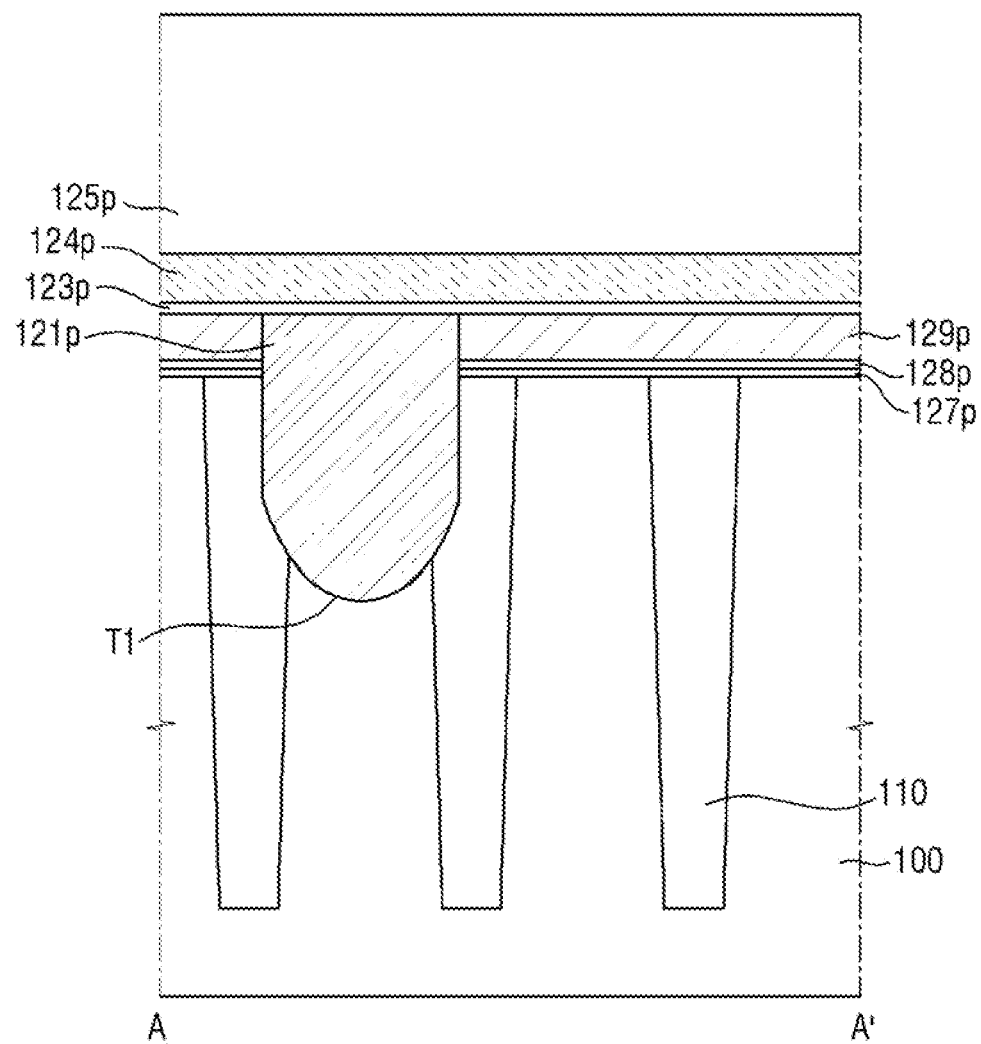
FIGS. 4, 5, 6, 7, 8, 9, 10 and 11 are cross-sectional views illustrating intermediate stages of fabrication, in a method for fabricating a semiconductor device according to an exemplary embodiment of the present inventive concept.

Referring to FIG. 4 the isolation layer 110 is formed within the substrate 100, thereby defining the active region AR (FIG. 1). The plurality of word lines WL (FIG. 1) extended in the second direction (e.g., the DR2 direction) and spaced apart from one another in the third direction (e.g., the DR3 direction) may be formed in the substrate 100.

Next, a first pre-insulation film 127p, a second pre-insulation film 128p, and a third pre-conductive film 129p may be stacked sequentially on the substrate 100 and the isolation layer 110.

Next, the first trench T1 may be formed by removing a portion of the substrate 100, a portion of the isolation layer 110, the first pre-insulation film 127p, the second pre-insulation film 128p, and the third pre-conductive film 129p in a region where the bit line contact 121 (FIG. 2) is formed. The first trench T1 may be formed by removing portions of adjacent isolation layers 110 and a portion of the substrate 100 therebetween.

Next, a pre-bit line contact 121p may be formed within the first trench T1. In this case, an upper surface of the pre-bit line contact 121p may be formed on the same plane as an upper surface of the third pre-conductive film 129p through a planarization process.

Next, a first pre-conductive film 123p, a second pre-conductive film 124p, and a pre-capping film 125p may be formed on the pre-bit line contact 121p and the third pre-conductive film 129p.

Figure 5:
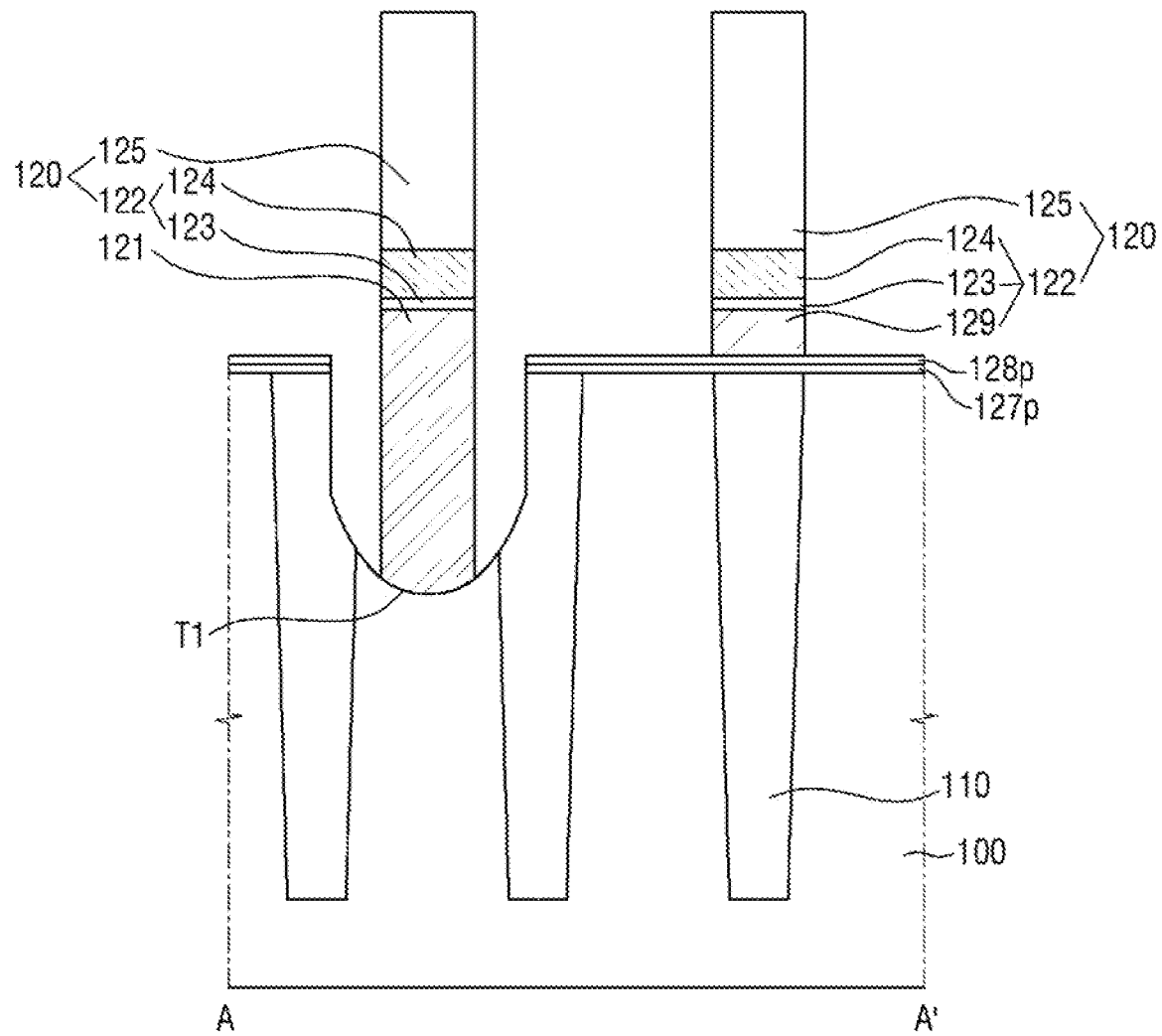

Referring to FIG. 5, the plurality of bit line structures 120 extended in the third direction (e.g., the DR3 direction) may be thrilled on the substrate 100 and the second pre-insulation film 128p by patterning the first pre-conductive film 123p, the second pre-conductive film 124p, the third pre-conductive film 129p, and the pre-capping film 125p.

In addition, the bit line contact 121 may be formed on a lower portion of the bit line structure 120 by patterning the pre-bit line contact 121p formed within the first trench T1.

Figure 6:
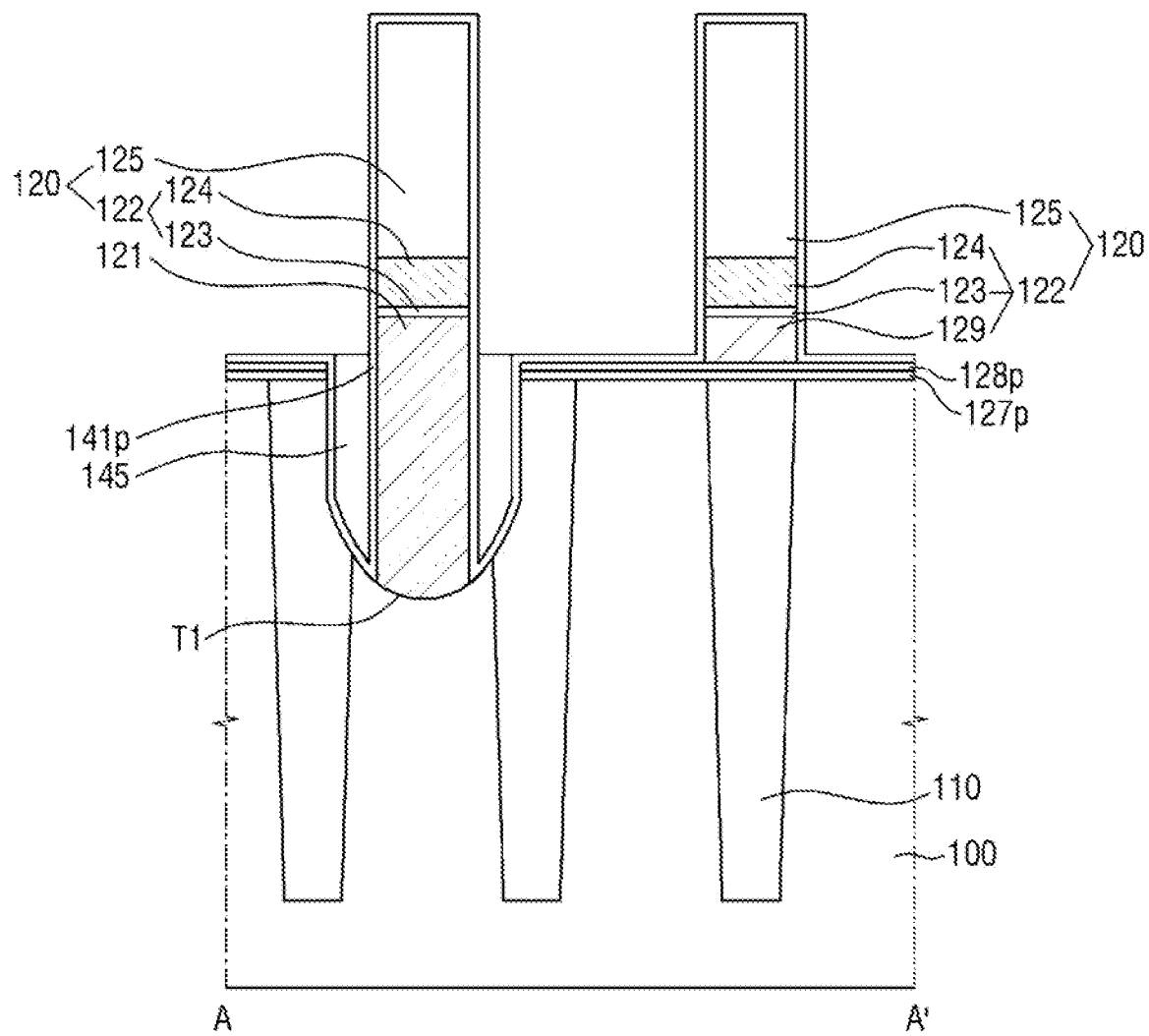
Figure 6:
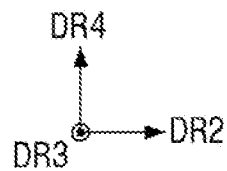

Referring to FIG. 6, a first pre-spacer film 141p may be formed on an upper surface of the second pre-insulation film 128p, a sidewall of the first trench T1, a sidewall of the bit line contact 121, and a sidewall and an upper surface of the bit line structure 120 (e.g., an upper surface of the capping pattern 125). The first pre-spacer film 141p may be conformally formed.

Next, the fifth spacer 145 may be formed to fill an inner portion of the first trench T1. In this case, an upper surface of the fifth spacer 145 may be formed on the same plane as an upper surface of the first pre-spacer film 141p formed on an upper surface of the second pre-insulation film 128p. However, the present inventive concept is not limited thereto.

Figure 7:
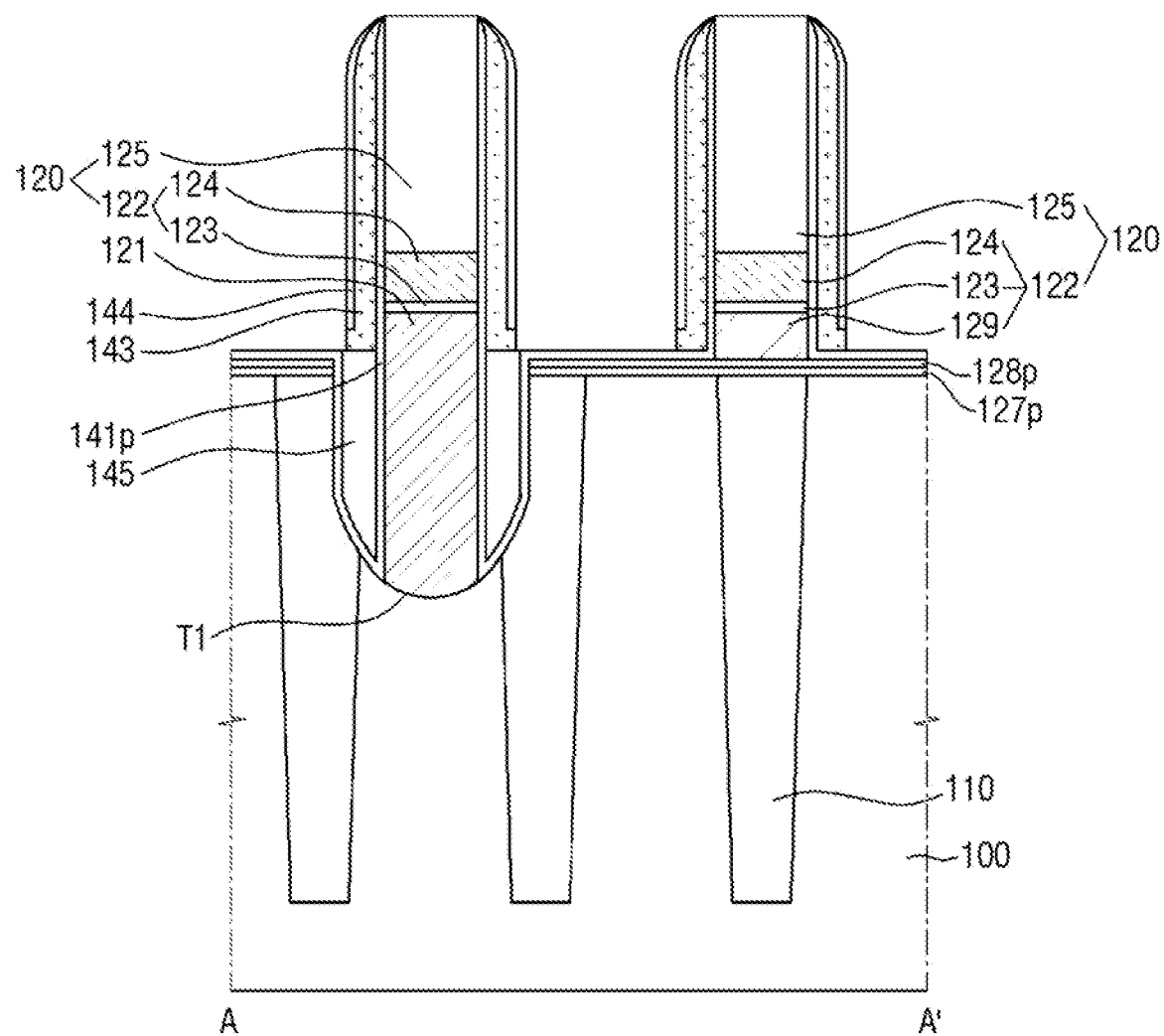
Figure 7:
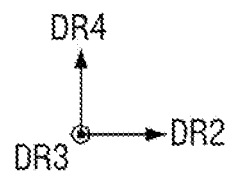

Referring to FIG. 7, the third spacer 143 and the fourth spacer 144 may be formed along a sidewall of the bit line contact 121 and a sidewall of the bit line structure 120.

The third spacer 143 and the fourth spacer 144 may be stacked sequentially on the first pre-spacer film 141p. The third spacer 143 and the fourth spacer 144 may be formed to overlap the fifth spacer 145 in the fourth direction (e.g., the DR4 direction) in a region where the bit line contact 121 is formed.

Figure 8:
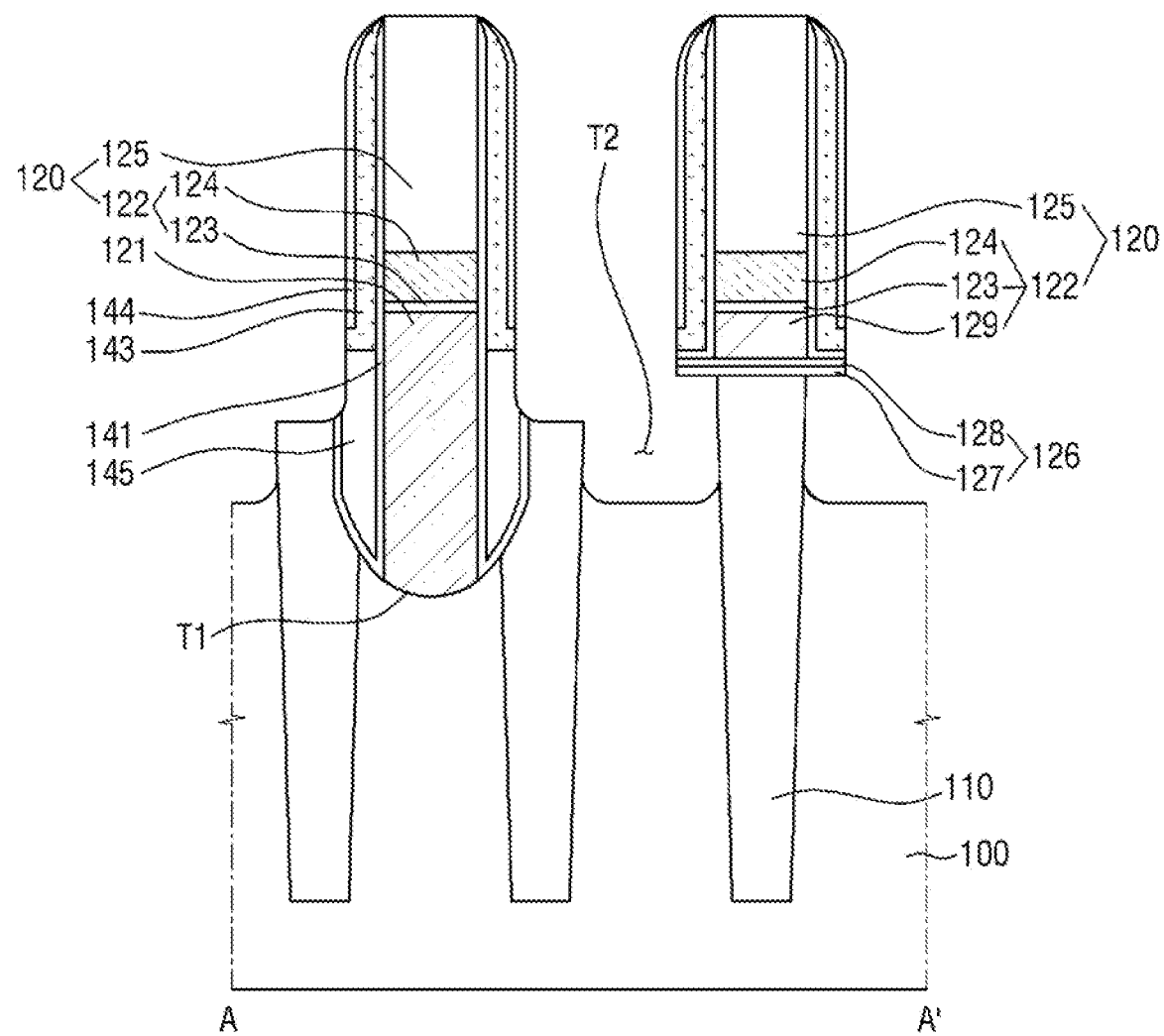
Figure 8:
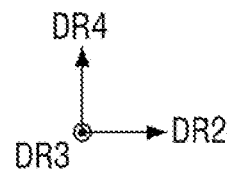

Referring to FIG. 8, the second trench T2 may be formed within the substrate 100. In the figures, it is illustrated that, the second trench T2 includes a region where the storage contact structure 130 (FIG. 2) is formed between the bit line structures 120.

The second trench T2 may be formed by penetrating through the first pre-instdation film 127p and the second pre-insulation film 128p. The second trench T2 may expose a portion of the sidewall of the fifth spacer 145, a portion of the isolation layer 110, and a portion of the active region AR of the substrate 100. In addition, the second trench T2 may expose a portion of the lower surface of the insulation pattern 126. For example, the remaining insulation pattern 126 may be overlapped by the isolation layer 110 at a lower surface and a bit line structure 120 at an upper surface. The second trench T2 may expose edge portions of the lower surface of the insulation pattern 126 that are not overlapped by the isolation layer 110.

Figure 9:
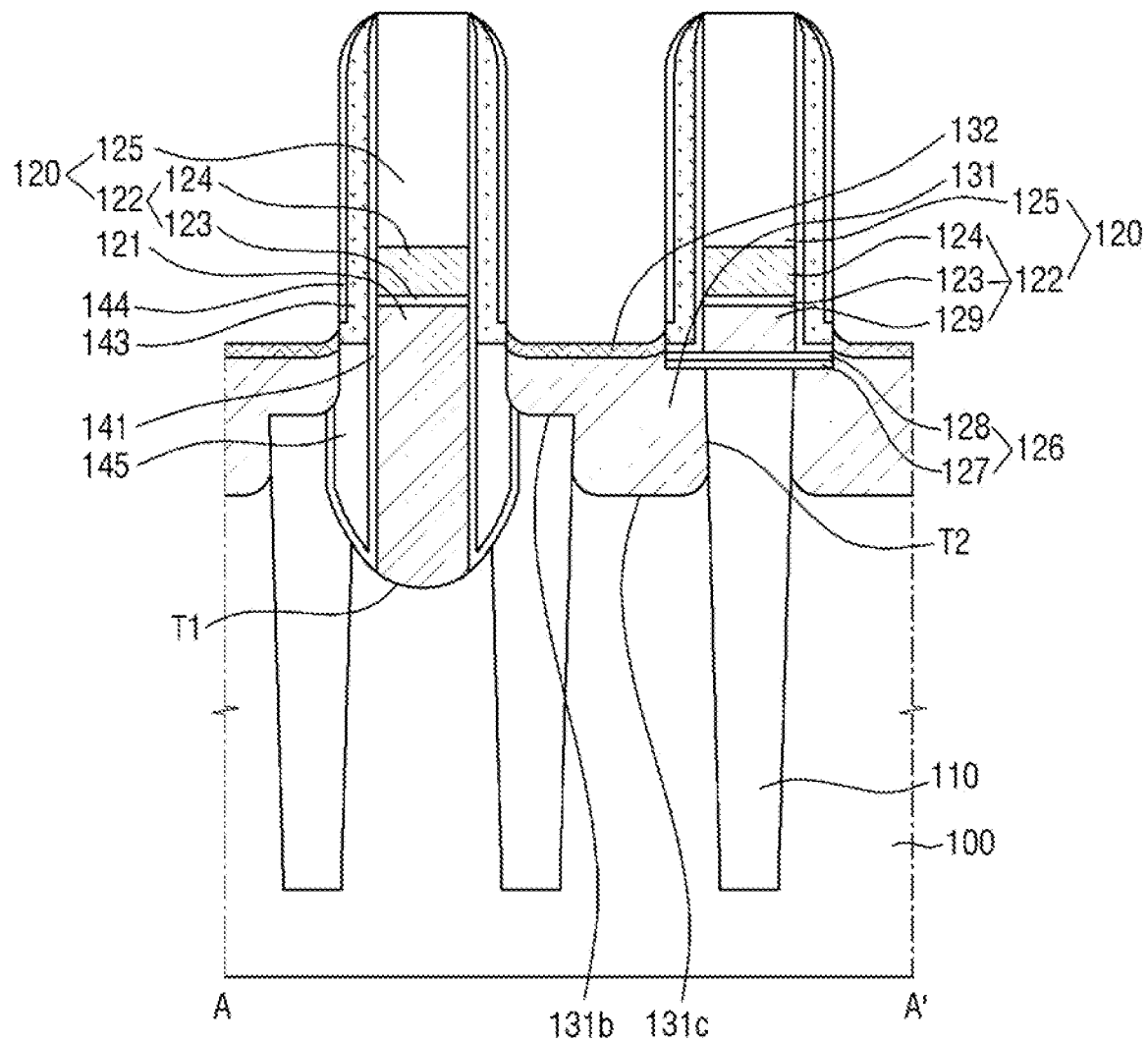
Figure 9:
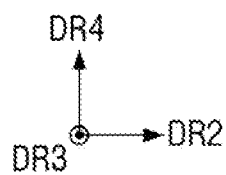

Referring to FIG. 9, the storage contact 131 and the silicide layer 132 may be formed sequentially within the second trench T2.

For example, the storage contact 131 may be formed through epitaxial growth. However, the present inventive concept is not limited thereto, in other words, in an exemplary embodiment of the present inventive concept, the storage contact 131 may be conformally formed on the lower surface and the sidewalls of the second trench T2, and then may be formed through an etching process.

For example, the storage contact 131 may be formed in contact with the lower surface of the insulation pattern 126 exposed to the second trench T2.

Next, the silicide layer 132 may be formed on the storage contact 131.

Figure 10:
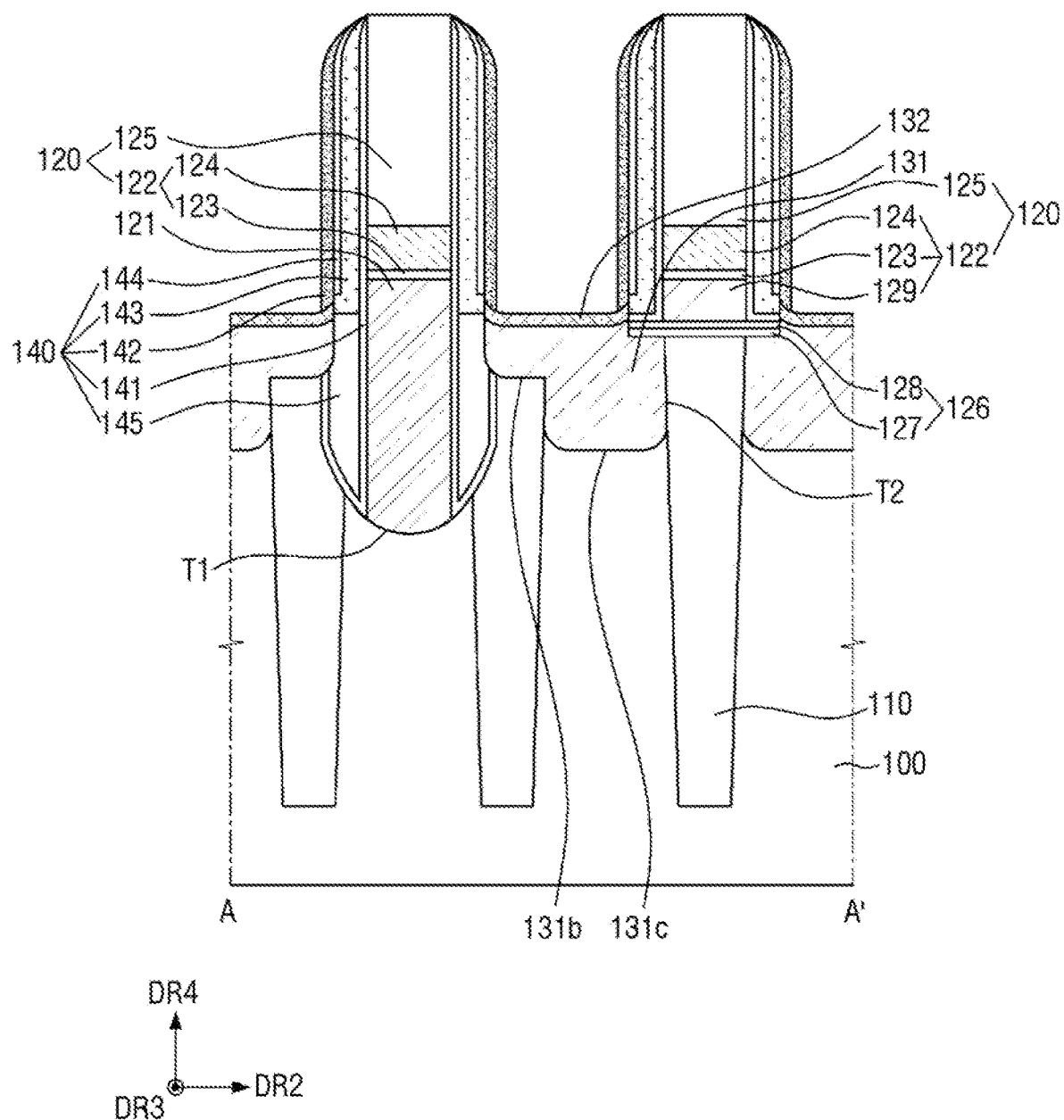

Referring to FIG. 10, the second spacer 142 may be formed along the sidewall of the third spacer 143 and the sidewall of the fourth spacer 144 exposed on the silicide layer 132.

A lower surface of the fourth spacer 144 may be in contact with an upper surface of the silicide layer 132. In addition, the lower surface of the fourth spacer 144 may overlap the upper surface of the silicide layer 132.

Figure 11:
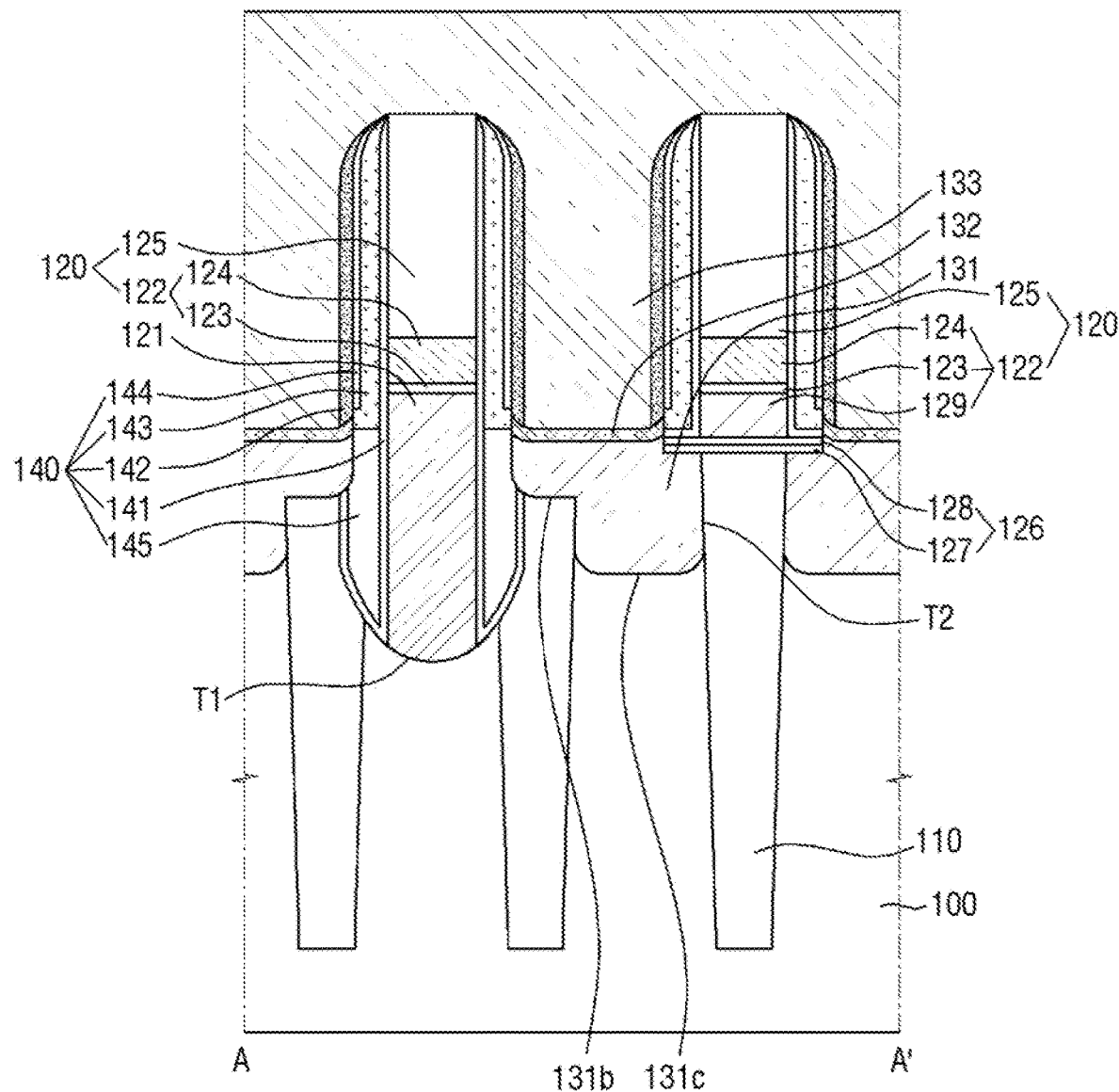
Figure 11:
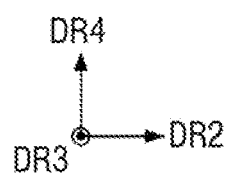

Referring to FIG. 11, the storage pad 133 may be former to cover the silicide layer 132, the second spacer 142, and the capping pattern 125.

Referring to FIG. 2, the third trench 13 may be formed by patterning the storage pad 133, such that the storage pads 133 forming the plurality of isolation regions can be formed.

The third trench 13 may be formed by etching a portion of the bit line structure 120 and a portion of the spacer structure 140.

Next, the interlayer insulation film 150 may be formed to fill on the upper surface of the storage pad 133 and the third trench T3.

Then, a portion of the upper surface of the storage pad 133 may be exposed by patterning the interlayer insulation film 150.

Next, the capacitor 160 may be formed on the interlayer insulation film 150. The capacitor 160 may be connected with the upper surface of the storage pad 133 exposed on the interlayer insulation film 150.

The semiconductor device according to an exemplary embodiment of the present inventive concept may be fabricated through the above-described processes.

Hereinbelow a Semiconductor device according to an exemplary embodiment of the present inventive concept will be described with reference to FIG. 12. The difference from the semiconductor device illustrated in FIG. 3 will be highlighted.

Figure 12:
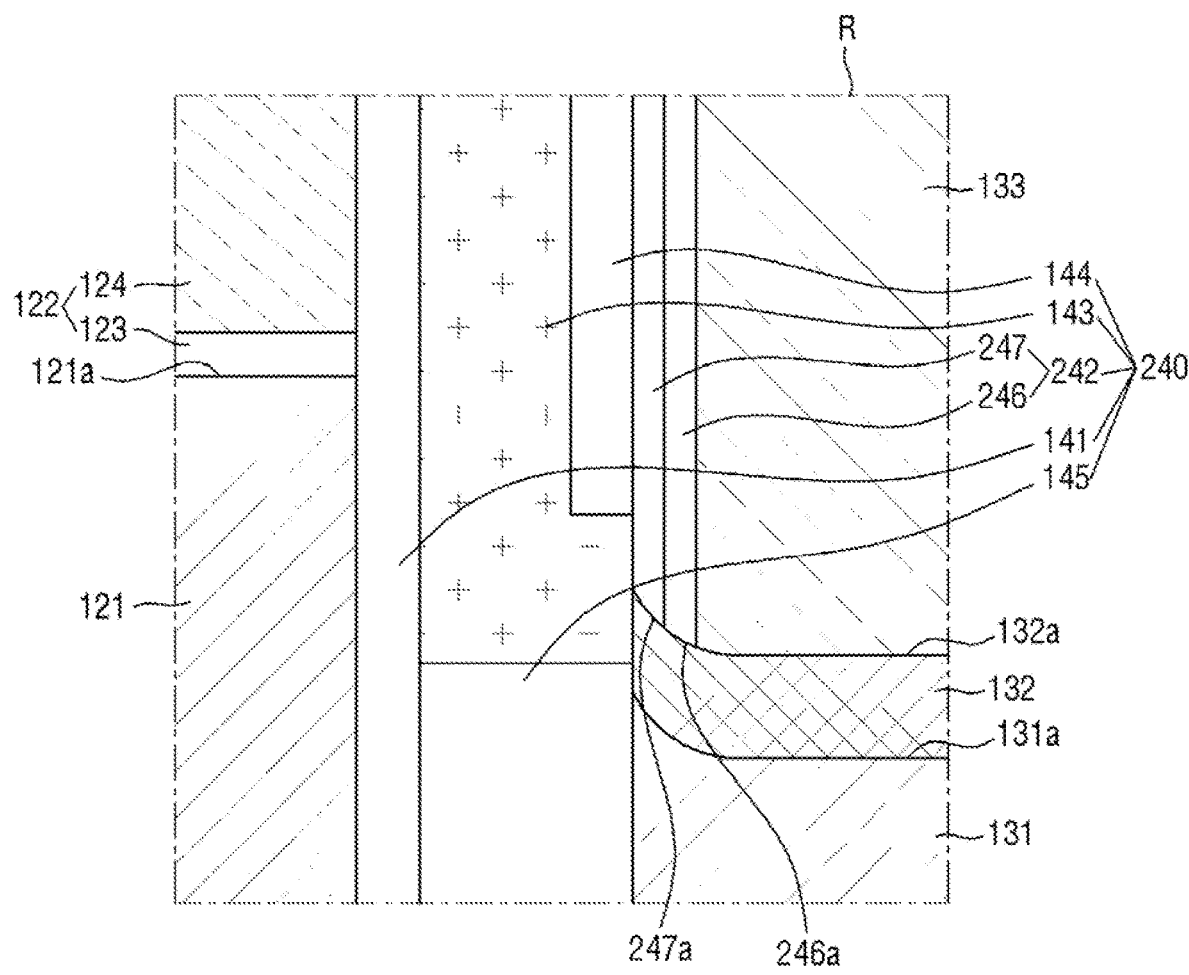
FIG. 12 is an enlarged view illustrating a cross-section of a semiconductor device according to an exemplary embodiment of the present inventive concept.

FIG. 12 is an enlarged view illustrating a cross-section of a semiconductor device according to an exemplary embodiment of the present inventive concept.

Referring to FIG. 12, in the semiconductor device according to an exemplary embodiment of the present inventive concept, a second spacer 242 included in a spacer structure 240 may be formed as a multi-layered film. For example, the second spacer 242 may include a sixth spacer 246 and a seventh spacer 247.

The sixth spacer 246 may be in contact with a sidewall of the storage pad 133. A lower surface 246a of the sixth spacer 246 may be in contact with the upper surface 132a of the silicide layer 132.

The seventh spacer 247 may be disposed between the first spacer 141 and the sixth spacer 246. For example, one sidewall of the seventh spacer 247 may be in contact with the third spacer 143 and the fourth spacer 144, and the other sidewall of the seventh spacer 247 may be in contact with the sixth spacer 246. A lower surface 247a of the seventh spacer 247 may be in contact with the upper surface 132a of the silicide layer 132.

Hereinbelow, a semiconductor device according to an exemplary embodiment of the present inventive concept will be described with reference to FIG. 13. The difference from the semiconductor device illustrated in FIG. 3 will be highlighted.

Figure 13:
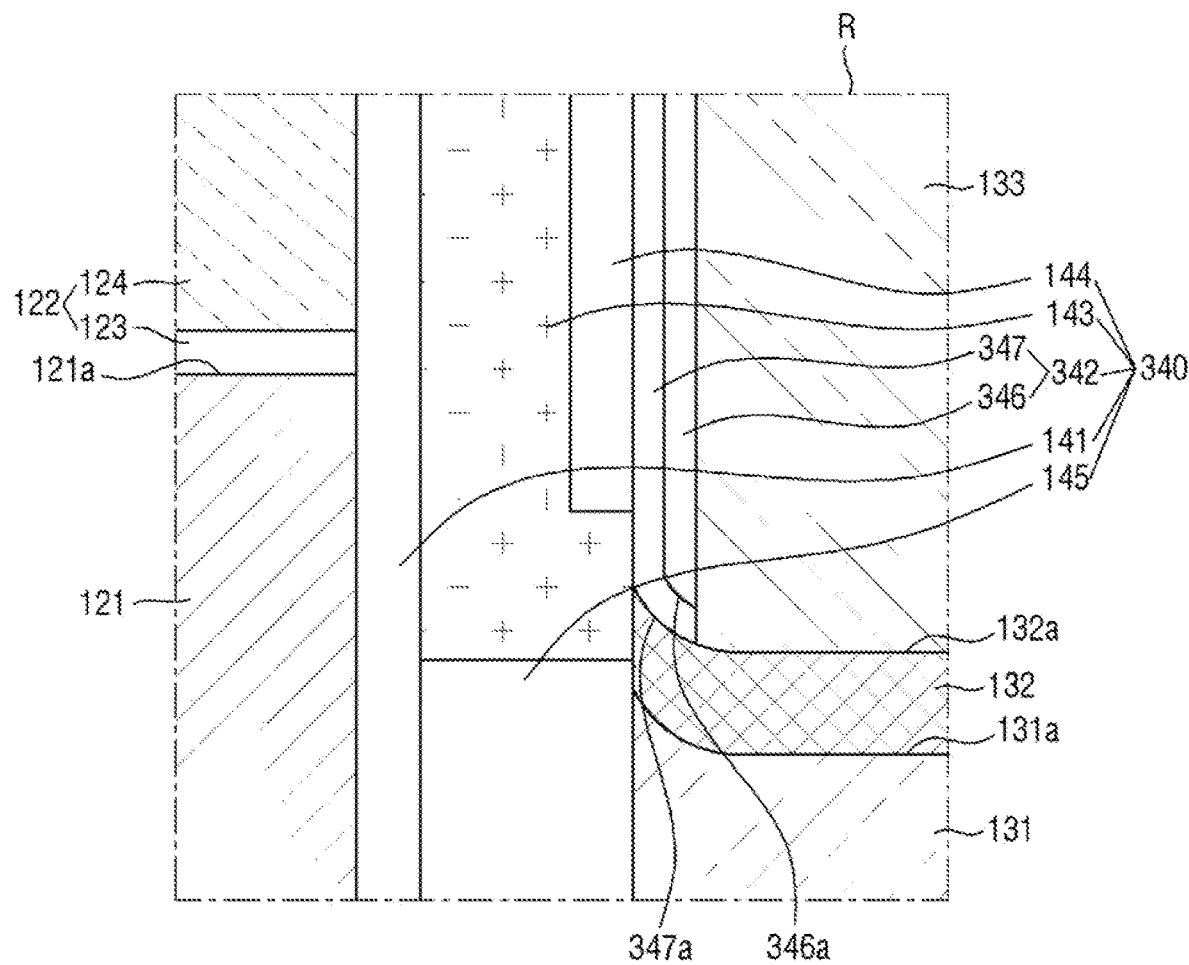
FIG. 13 is an enlarged view illustrating a semiconductor device according to an exemplary embodiment of the present inventive concept.

FIG. 13 is an enlarged view illustrating a cross-section of a semiconductor device according to an exemplary embodiment of the present inventive concept.

Referring to FIG. 13, in the semiconductor device according to an exemplary embodiment of the present inventive concept, a second spacer 342 included in a spacer structure 340 may be formed as a multi-layered film. For example, the second spacer 342 may include a sixth spacer 346 and a seventh spacer 347.

The sixth spacer 346 may be in contact with a sidewall of the storage pad 133. A lower surface 346a of the sixth spacer 346 may be in contact with the seventh spacer 347.

The seventh spacer 347 may be disposed between the first spacer 141 and the sixth, spacer 346 and between the silicide layer 132 and the sixth spacer 346.

For example, a portion of the seventh spacer 347 may be in contact with a sidewall of the storage pad 133. One sidewall of the seventh spacer 347 may be in contact with the third spacer 143 and the fourth spacer 144, and the other sidewall of the seventh spacer 347 may be in contact with the sixth spacer 346. A lower surface 347a of the seventh spacer 347 may be in contact with the upper surface 132a of the silicide layer 132. For example, a lower portion of the seventh spacer 347 including the lower surface 347a may line the curved portion of the silicide layer 132 and thus the seventh spacer may have a corresponding curved shape. The lower surface 346a of the sixth spacer may have a complementary shape to the curved upper surface of the lower portion of the seventh spacer 347.

Hereinbelow, a semiconductor device according to an exemplary embodiment of the present inventive concept will be described with reference to FIG. 14. The difference from the semiconductor device illustrated in FIG. 2 will be highlighted.

Figure 14:
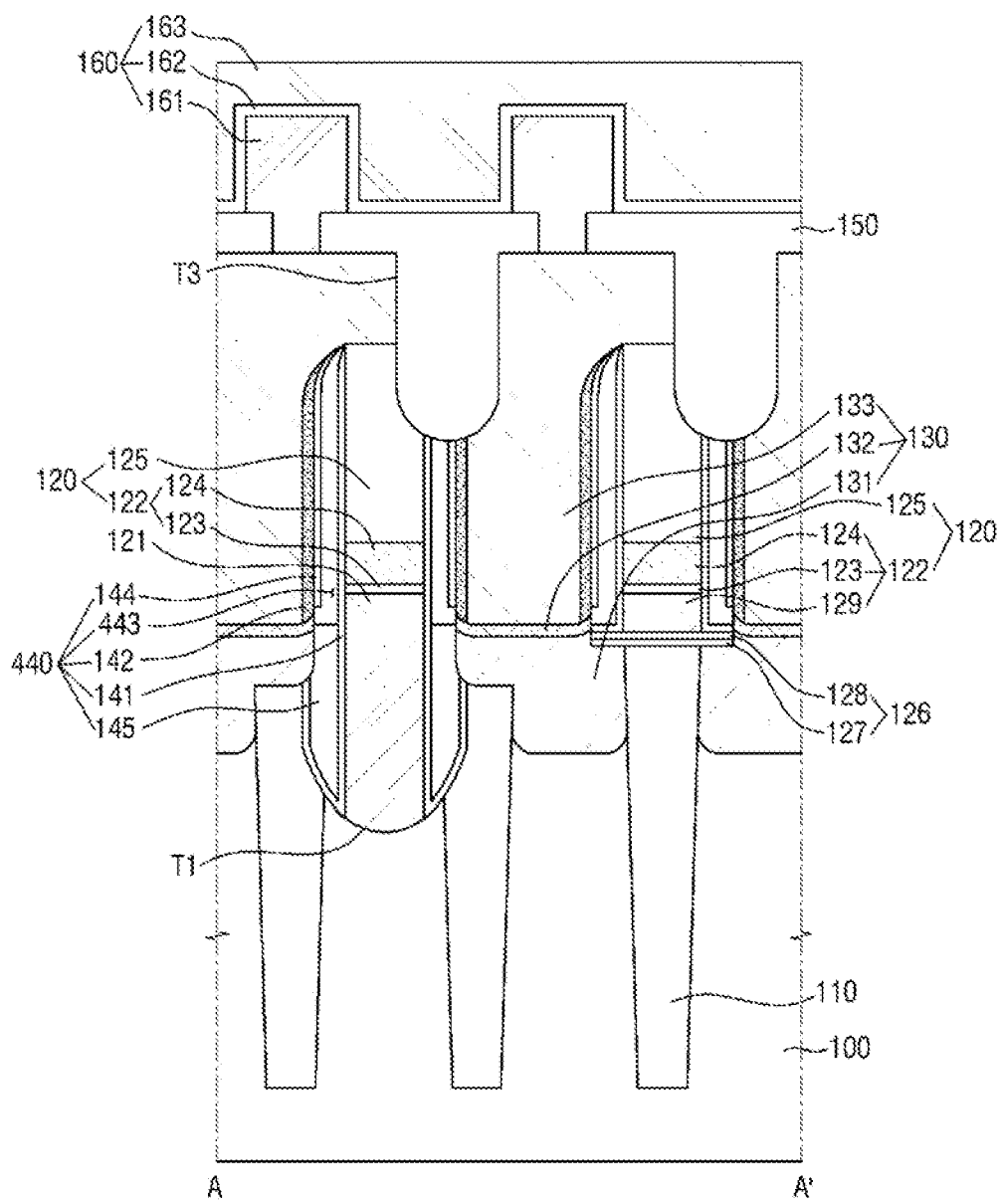

FIG. 14 is a cross-sectional view illustrating a cross-section of a semiconductor device according to an exemplary embodiment of the present inventive concept.

Referring to FIG. 14, in the semiconductor device according to an exemplary embodiment of the present inventive concept, a third spacer 443 included in a spacer structure 440 may be an air spacer. In other words, the third spacer 443 disposed between the first spacer 141 and the fourth spacer 144 may include air. However, the present inventive concept is not limited thereto.

Hereinbelow, a semiconductor device according to, an exemplary embodiment of the present inventive concept will be described with reference to FIG. 15. The difference from the semiconductor device illustrated in FIG. 2 will be highlighted.

Figure 15:
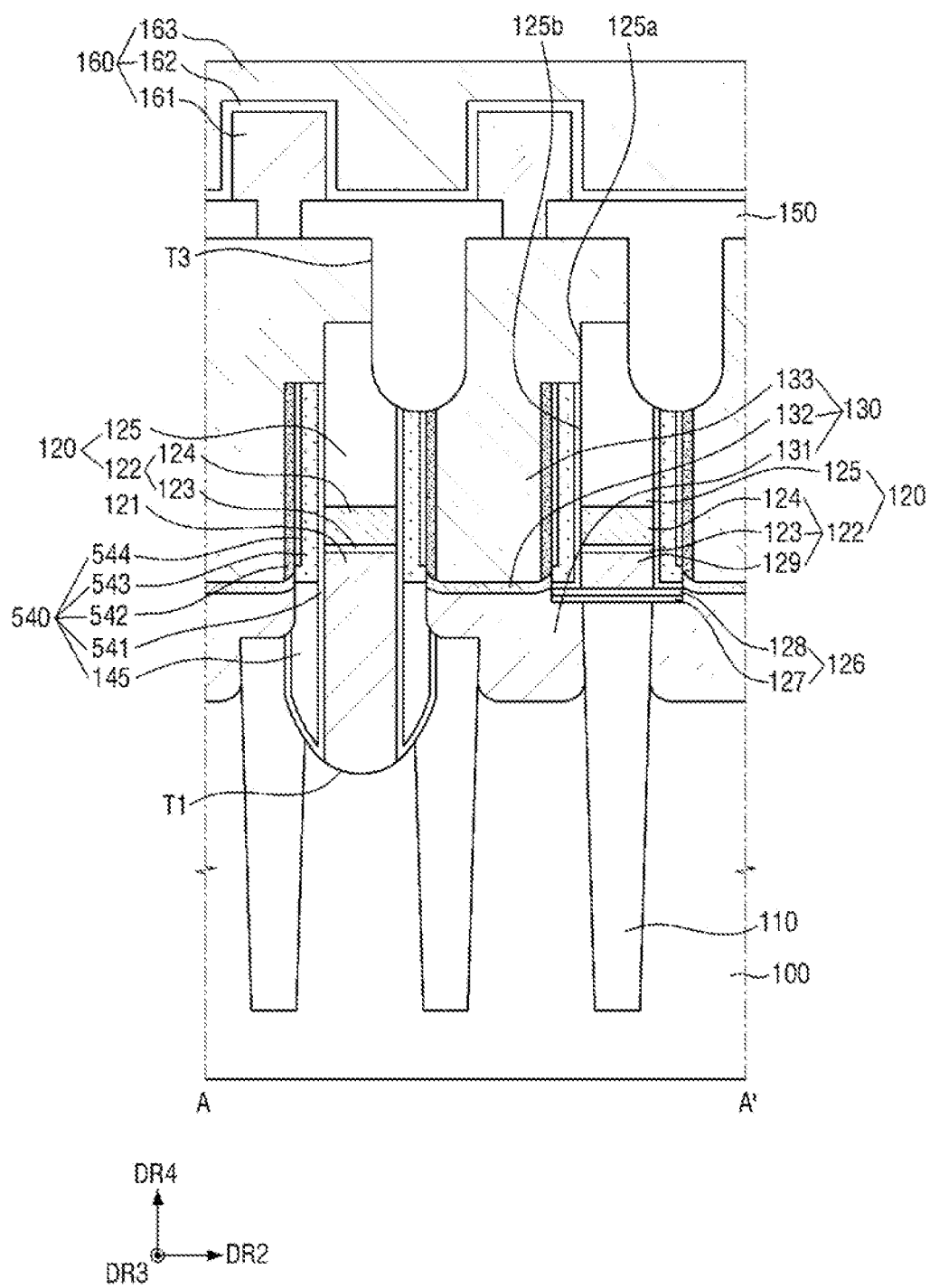
FIG. 15 is a cross-sectional view illustrating a cross-section of a semiconductor device according to an exemplary embodiment of the present inventive concept.

FIG. 15 is a cross-sectional illustrating a cross-section of a semiconductor device according to an exemplary embodiment of the present inventive concept.

Referring to FIG. 15, in the semiconductor device according to an exemplary embodiment of the present inventive concept, a portion of the sidewall of the capping pattern 125 included in the bit line structure 120 may be in contact with the storage pad 133.

A spacer structure 540 may not be formed on an upper sidewall 125a of the capping pattern 125. In other words, the first to fourth spacers 541, 542, 543, 544 may be formed only on a lower sidewall 125b of the capping pattern 125. The upper sidewall 125a of the capping pattern 125 may be in contact with the storage pad 133, and the lower sidewall 125b of the capping pattern 125 may be in contact with the first spacer 541.

Respective upper surfaces of the first to fourth spacers 541, 542, 543, 544 may be formed on the same plane. However, the present inventive concept is not limited thereto.

Hereinbelow, a semiconductor device according to an exemplary embodiment of the present inventive concept will be described with reference to FIG. 16. The difference from the semiconductor device illustrated in FIG. 2 will be highlighted.

Figure 16:
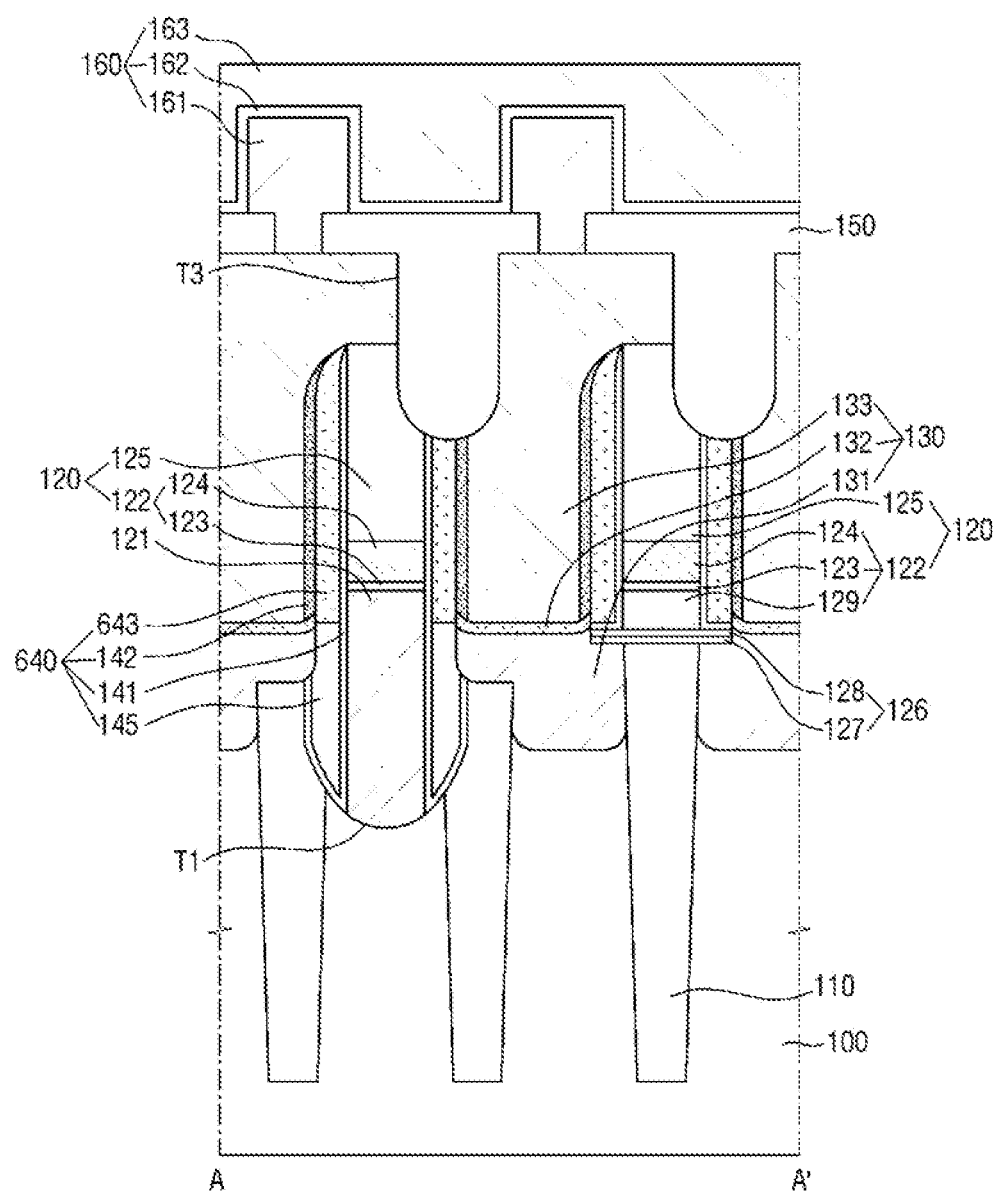
FIG. 16 is a cross-sectional view illustrating a cross-section of a semiconductor device according to an exemplary embodiment of the present inventive concept.

FIG. 16 is a cross-sectional view illustrating a cross-section of a semiconductor device according to an exemplary embodiment of the present inventive concept.

Referring to FIG. 16, in the semiconductor device according to an exemplary embodiment of the present inventive concept, a spacer structure 640 may include the first spacer 141, the second spacer 142, a third spacer 643, and the fifth spacer 145.

The third spacer 643 may be disposed to completely fill a region between the first spacer 141 and the second spacer 142. In other words, one sidewall of the third spacer 643 may be in contact with the first spacer 141, and the other sidewall of the third spacer 643 may be in contact with the second spacer 142. For example, the fourth spacer 144 may be omitted.

Hereinbelow, a semiconductor device according to an exemplary embodiment of the present inventive concept will be described with reference to FIG. 17. The difference from the semiconductor device illustrated in FIG. 3 will be highlighted.

Figure 17:
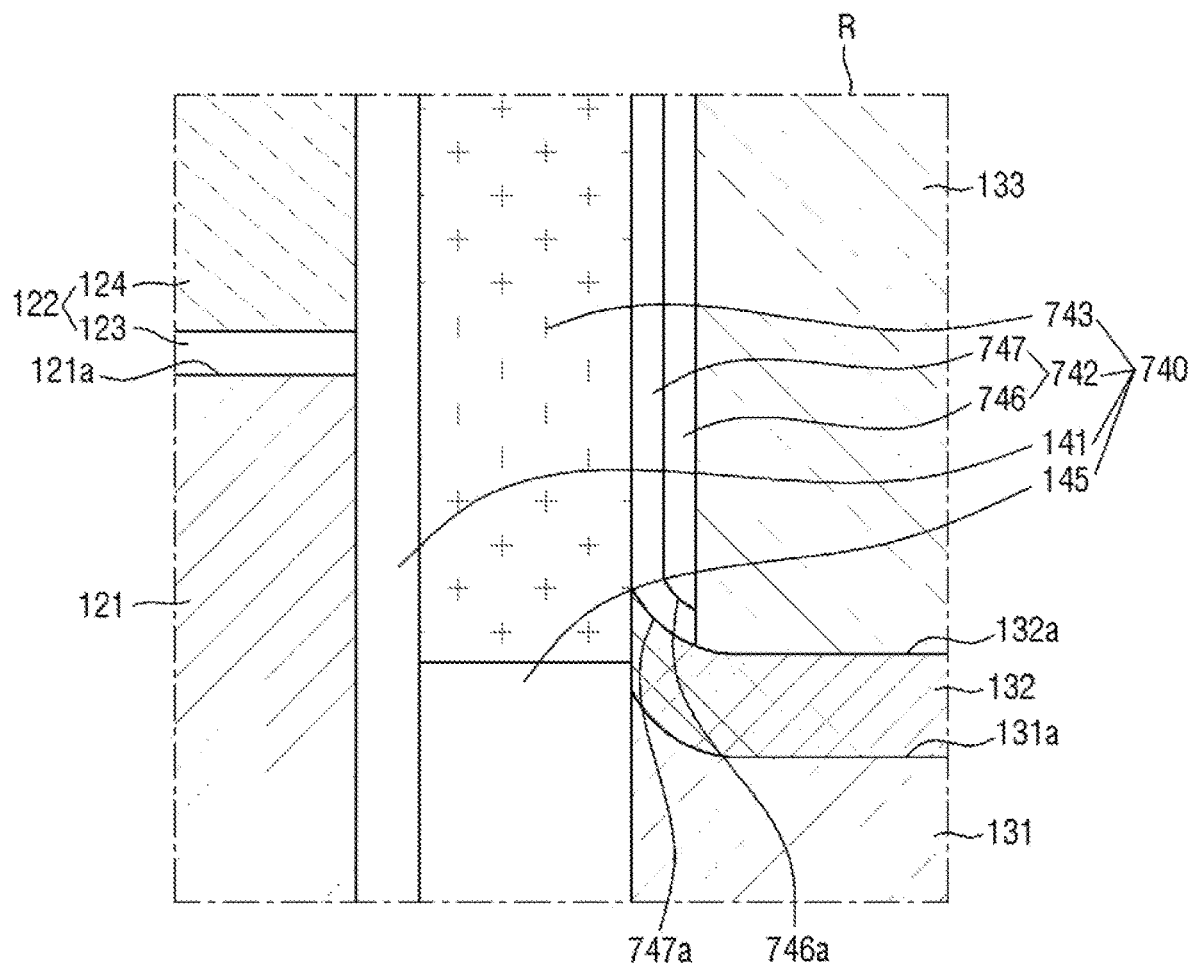
FIG. 17 is an enlarged view illustrating a cross-section of a semiconductor device according to an exemplary embodiment of the present inventive concept.

FIG. 17 is an enlarged view illustrating a cross-section of a semiconductor device according to an exemplary embodiment of the present inventive concept.

Referring to FIG. 17, in the semiconductor device according to an exemplary embodiment of the present inventive concept, a second spacer 742 included in a spacer structure 740 may be formed as a multi-layered film. For example, the second spacer 742 may include a sixth spacer 746 and a seventh spacer 747.

The sixth spacer 746 may be in contact with a sidewall of the storage pad 133. A lower surface 746a of the sixth spacer 746 may be in contact with the seventh spacer 747.

The seventh spacer 747 may be disposed between the first spacer 141 and the sixth spacer 746, and between the silicide layer 132 and the sixth spacer 746.

For example, a portion of the seventh spacer 747 may be in contact with a sidewall of the storage pad 133 (e.g., a curled end portion). One sidewall of the seventh spacer 747 may be in contact with the third spacer 743, and the other sidewall of the seventh spacer 747 may be in contact with the sixth spacer 746. A lower surface 747a of the seventh spacer 747 may be in contact with the upper surface 132a of the silicide layer 132.

The third spacer 743 may be disposed to completely fill between the first spacer 141 and the second spacer 742. In other words, one sidewall of the third spacer 743 may be in contact with the first spacer 141, and the other sidewall of the third spacer 743 may be in contact snit the second spacer 742.

Hereinbelow, a semiconductor device according to an exemplary embodiment of the present inventive concept will be described with reference to FIG. 18. The difference from the semiconductor device illustrated in FIG. 2 will be highlighted.

Figure 18:
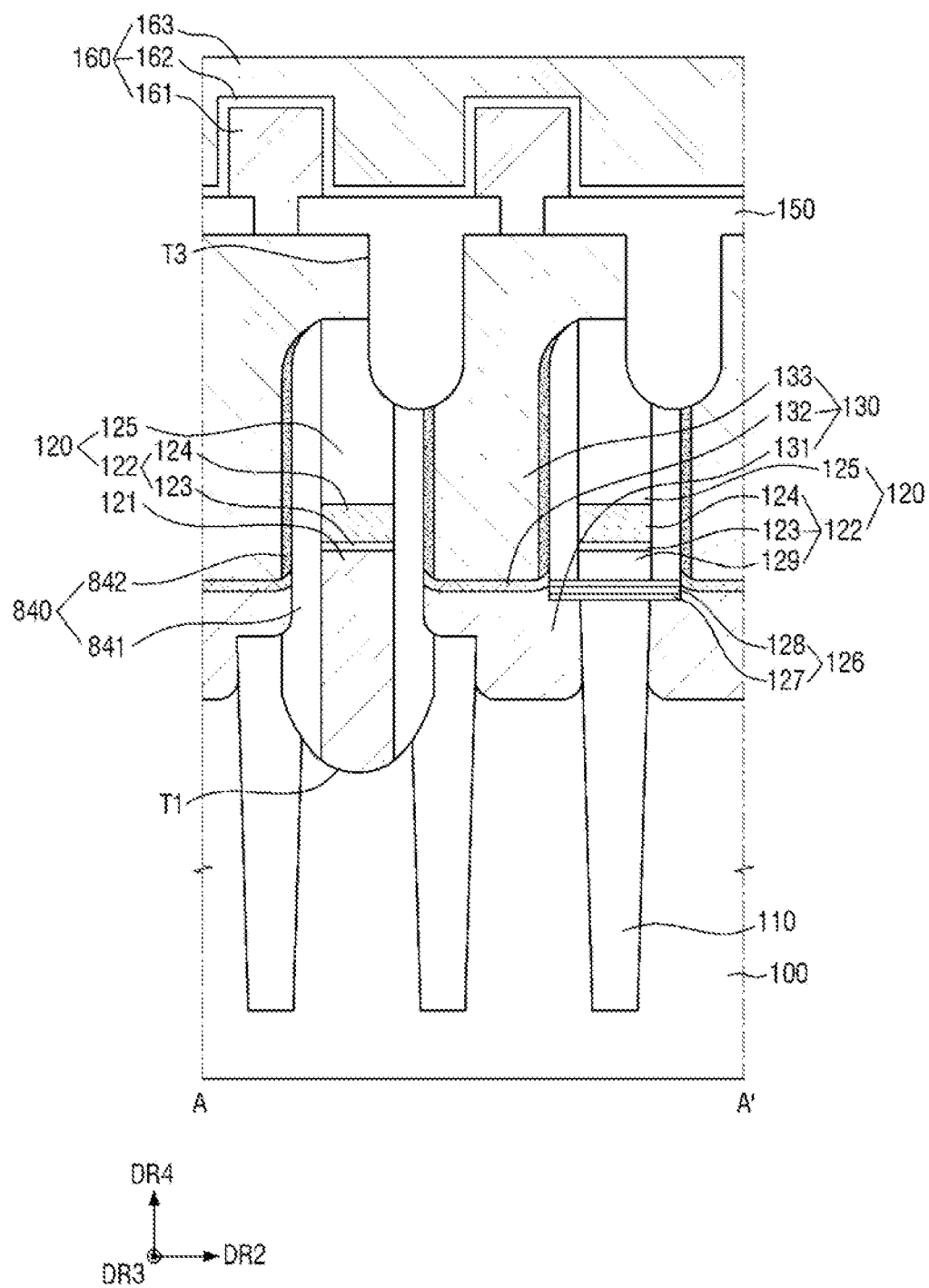
FIG. 18 is a cross-sectional view illustrating a cross-section of a semiconductor device according to an exemplary embodiment of the present inventive concept.

FIG. 18 is a cross-sectional view illustrating a cross-section of a semiconductor device according to an exemplary embodiment of the present inventive concept.

Referring to FIG. 18, in the semiconductor device according to an exemplary embodiment of the present inventive concept, a spacer structure 840 may include a first spacer 841 and a second spacer 842.

The first spacer 841 may be disposed along sidewalls of the bit line contact 121 and the bit line structure 120. The second spacer 842 may be in contact with the first spacer 841 on the first spacer 841. A lower surface of the second spacer 842 may be in contact with an upper surface of the silicide layer 132.

Hereinbelow, a semiconductor device according to an exemplary embodiment of the present inventive concept will be described with reference to FIG. 19. The difference from the semiconductor device illustrated in FIG. 2 will be highlighted.

Figure 19:
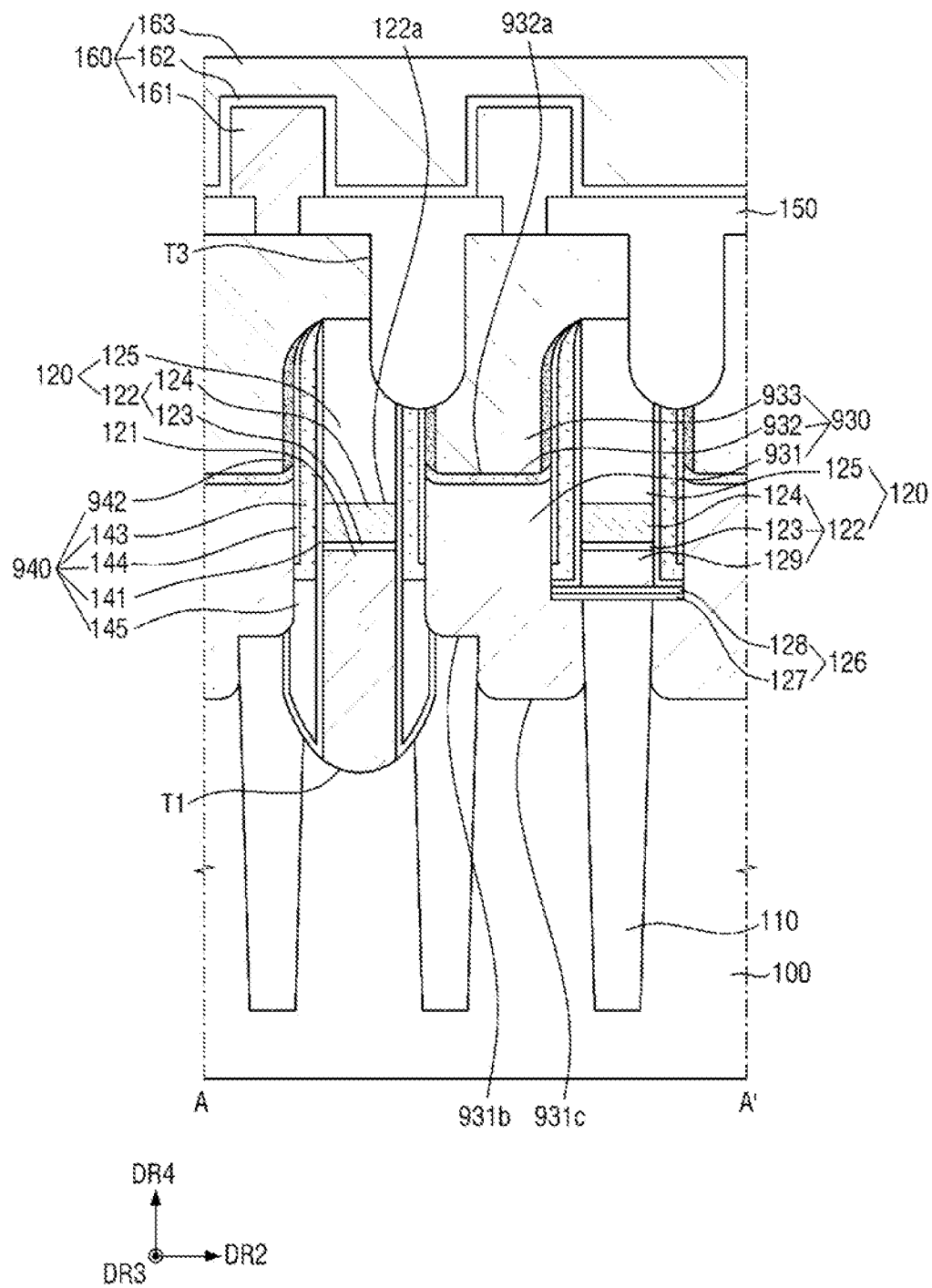
FIG. 19 is a cross-sectional view illustrating a cross-section of semiconductor device according to an exemplary embodiment of the present inventive concept.

FIG. 19 is a cross-sectional view of a semiconductor device according to an exemplary embodiment of the present inventive concept.

Referring to FIG. 19, in the semiconductor device according to an exemplary embodiment of the present inventive concept, a silicide layer 932 included in a storage contact structure 930 may be disposal higher than the bit line 122.

In other words, an upper surface 932a of the silicide layer 932 may be higher than an upper surface 122a of the bit line 122.

A storage contact 931 may be disposed adjacent to at least one side of the bit line contact 121 and the bit line 122. Further, a storage pad 933 may be disposed overlapping at least one side of the capping pattern 125.

A lower surface of a second spacer 942 included in a spacer structure 940 may be in contact with the upper surface of the silicide layer 932.

According to exemplary embodiments of the present inventive concept described herein, a semiconductor device is provided which has an additional spacer protruding toward a storage contact structure, thereby enhancing reliability.

Exemplary embodiments of the present inventive concept also provide for a semiconductor device which has a storage pad disposed adjacent to an active region of a substrate, thereby enhancing reliability.

While exemplary embodiments of the present inventive concept have been shown and described above, it will be understood by those of ordinary skill in the art that various changes in form and details may be made therein without departing from the spirit and scope of the present inventive concept as defined by the following claims.

What is claimed is:

1. A semiconductor device, comprising:
a substrate;
a bit line structure disposed on the substrate;
a trench adjacent to at least one side of the bit line structure;
a storage contact structure disposed within the trench, and comprising a storage contact, a silicide layer, and a storage pad; and
a spacer structure disposed between the bit line structure and the storage contact structure,
wherein the spacer structure comprises:
a first spacer in contact with a sidewall of the bit line structure; and
a second spacer disposed on the first spacer, the second spacer in contact with a sidewall of the storage pad, the second spacer includes an insulating material, and
wherein a lower surface of the second spacer is in contact with an upper surface of the silicide layer.

2. The semiconductor device of claim 1, further comprising:
a bit line contact disposed on the substrate,
wherein an upper surface of the storage contact is disposed below an upper surface of the contact.

3. The semiconductor device of claim 2, further comprising a third spacer disposed between the first spacer and the second spacer.

4. The semiconductor device of claim 3, further comprising a fourth spacer disposed between the third spacer and the second spacer.

5. The semiconductor device of claim 4, wherein the third spacer is an air spacer.

6. The semiconductor device of claim 3, wherein the hit line structure comprises a bit line and a capping pattern disposed on the bit line,
wherein a lower Sidewall of the capping pattern is in contact with the first spacer, and
wherein an upper sidewall of the capping pattern is in contact with the storage pad.

7. The semiconductor device of claim 2, wherein the second spacer comprises:

a fifth spacer in contact with the sidewall of the storage pad; and
a sixth spacer disposed between the first spacer and the fifth spacer.

8. The semiconductor device of claim 7, wherein a lower surface of the fifth spacer and a lower surface of the sixth spacer are in contact with the upper surface of the silicide layer.

9. The semiconductor device of claim 1, wherein a first thickness of the spacer structure in contact with a sidewall of the storage pad is larger than second thickness of the spacer structure in contact with a sidewall of the storage contact.

10. The semiconductor device of claim 1, further comprising a capacitor disposed on the storage contact structure and electrically connected with the storage pad.

11. A semiconductor device, comprising
a substrate;
a bit line contact disposed on the substrate;
a bit line structure disposed on the bit line Contact;
a trench adjacent to at least one side of the bit line structure;
a storage contact structure disposed within the trench, and comprising a storage contact, a silicide layer, and a storage pad which are stacked sequentially;
a first spacer in contact with a sidewall of the bit line structure; and
a second spacer disposed on the first spacer, the second spacer in contact with a sidewall of the storage pad and an upper surface of the silicide layer, the second spacer includes an insulating material.

12. The semiconductor device of claim 11, wherein an upper surface of the storage contact is lower than an upper surface of the bit line contact.

13. The semiconductor device of claim 11, wherein the bit line structure comprises a bit line and a capping pattern disposed on the bit line, and
wherein the upper surface of the silicide layer is higher than an upper surface of the bit line.

14. The semiconductor device of claim 11, wherein the storage contact comprises:
a first lower surface in contact with an isolation layer within the substrate; and
a second lower surface in contact with an active region defined by the isolation layer,
wherein the first lower surface is higher than the second lower surface.

15. The semiconductor device of claim 11, further comprising:
a third spacer disposed between the first spacer and the second spacer; and
a fourth spacer disposed between the third spacer and the second spacer.

16. The semiconductor device of claim 11, wherein the second spacer comprises:
a fifth spacer in contact with the sidewall of the storage pad; and
a sixth spacer disposed between the first spacer and the fifth spacer.

17. A semiconductor device, comprising:
a substrate comprising an isolation layer and an active region adjacent to the isolation layer;
a bit line contact disposed on the substrate;
a bit line structure disposed on the bit line contact;
a trench adjacent to at least one side of the bit line structure;

a storage contact structure disposed within the trench, and comprising a storage contact, a suicide layer, and a storage pad which are stacked sequentially;

first, second, third and fourth spacers disposed between the bit line structure and the storage contact structure, wherein the first, second, third and fourth spacers are stacked sequentially on a sidewall of the bit line structure; and a capacitor disposed on the storage contact structure and electrically connected with the storage pad, wherein an upper surface of the storage contact is lower than an upper surface of the bit line contact, and wherein a lower surface of the fourth spacer is in contact with an upper surface of the suicide laver, the fourth spacer includes an insulating material.

18. The semiconductor device of claim 17, wherein the bit line structure comprises a line and a capping pattern disposed on the bit line, and wherein the upper surface of the silicide layer is lower than an upper surface of the bit line.

19. The semiconductor device of claim 17, wherein the fourth spacer comprises:

a fifth spacer disposed on the third spacer and having a lower surface in contact with the upper surface of the silicide laver, and a sixth spacer disposed on the fifth spacer.

20. The semiconductor device of claim 17, wherein the second spacer is air spacer.

* * * * *